US012412744B2

(12) United States Patent
Chowdhury et al.

(10) Patent No.: US 12,412,744 B2
(45) Date of Patent: Sep. 9, 2025

(54) DEVICES AND METHODS INVOLVING ACTIVATION OF BURIED DOPANTS USING ION IMPLANTATION AND POST-IMPLANTATION ANNEALING

(71) Applicants: The Board of Trustees of the Leland Stanford Junior University, Stanford, CA (US); The Regents of the University of California, Oakland, CA (US)

(72) Inventors: Srabanti Chowdhury, San Ramon, CA (US); Dong Ji, San Jose, CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 707 days.

(21) Appl. No.: 17/609,194

(22) PCT Filed: May 15, 2020

(86) PCT No.: PCT/US2020/033220
§ 371 (c)(1),
(2) Date: Nov. 5, 2021

(87) PCT Pub. No.: WO2020/232385
PCT Pub. Date: Nov. 19, 2020

(65) Prior Publication Data
US 2022/0230883 A1     Jul. 21, 2022

Related U.S. Application Data

(60) Provisional application No. 62/915,488, filed on Oct. 15, 2019, provisional application No. 62/848,974, filed on May 16, 2019.

(51) Int. Cl.
*H01L 21/265*     (2006.01)
*H01L 21/02*     (2006.01)
(Continued)

(52) U.S. Cl.
CPC .... *H01L 21/26546* (2013.01); *H01L 21/0254* (2013.01); *H01L 21/266* (2013.01); *H01L 21/3245* (2013.01); *H10D 62/8503* (2025.01)

(58) Field of Classification Search
None
See application file for complete search history.

(56) References Cited

U.S. PATENT DOCUMENTS

| 5,926,726 A | 7/1999 | Bour et al. |
| 6,537,838 B2 | 3/2003 | Stockman |

(Continued)

FOREIGN PATENT DOCUMENTS

| CN | 104091872 A | 10/2014 |
| CN | 107575736 A | 1/2018 |

(Continued)

OTHER PUBLICATIONS

K. Nomoto et al. "1.7-kV and 0.55-mΩ.cm2 GaN p-n Diodes on Bulk GaN Substrates With Avalanche Capability," in IEEE Electron Device Letters, vol. 37, No. 2, pp. 161-164, Feb. 2016, doi: 10.1109/LED.2015.2506638; (Year: 2016).*

(Continued)

*Primary Examiner* — Sue A Purvis
*Assistant Examiner* — Seyon Ali-Simah Punchbeddell
(74) *Attorney, Agent, or Firm* — Crawford Maunu PLLC

(57) ABSTRACT

In certain examples, methods and semiconductor structures are directed to use of a doped buried region (e.g., Mg-dopant) including a III-Nitride material and having a diffusion path ("ion diffusion path") that includes hydrogen introduced by using ion implantation via at least one ion species. An ion implantation thermal treatment causes hydrogen to diffuse through the ion implanted path and causes activation of the buried region. In more specific examples in which such semiconductor structures have an (Continued)

ohmic contact region at which a source of a transistor interfaces with the buried region, the ohmic contact region is without etching-based damage due at least in part to the post-ion implantation thermal treatment.

30 Claims, 25 Drawing Sheets

(51) Int. Cl.
*H01L 21/266* (2006.01)
*H01L 21/324* (2006.01)
*H10D 62/85* (2025.01)

(56) References Cited

U.S. PATENT DOCUMENTS

| | | | |
|---|---|---|---|
| 8,937,338 | B2 | 1/2015 | Chowdhury et al. |
| 10,312,361 | B2 | 6/2019 | Chowdhury et al. |
| 2008/0081390 | A1 | 4/2008 | Gaska et al. |
| 2009/0072254 | A1 | 3/2009 | Chakraborty |
| 2013/0026489 | A1 | 1/2013 | Gambin et al. |
| 2015/0221760 | A1 | 8/2015 | Kub et al. |
| 2016/0197151 | A1* | 7/2016 | Han ............... H01L 21/306 438/468 |
| 2017/0125574 | A1* | 5/2017 | Chowdhury ........ H01L 29/7787 |
| 2018/0358226 | A1* | 12/2018 | Lee ................ H01L 21/02535 |
| 2019/0115448 | A1* | 4/2019 | Chowdhury ...... H01L 29/66977 |

FOREIGN PATENT DOCUMENTS

| | | |
|---|---|---|
| TW | 648725 B | 8/2003 |
| WO | 03/041230 A2 | 5/2003 |
| WO | 2015/175915 A1 | 11/2015 |
| WO | 2017/180633 A1 | 10/2017 |
| WO | WO-2017197179 A1 * | 11/2017 ......... H01L 21/0254 |

OTHER PUBLICATIONS

USPTO. International Search Report and Written Opinion dated Aug. 17, 2020, for parent PCT Application No. PCT/US2020/033220, 8 pages.

Chowdhury et al., CAVET on Bulk GaN Substrates Achieved With MBE-Regrown AlGaN/GaN Layers to Suppress Dispersion, IEEE Electronic Device Letters, vol. 33, No. 1, Jan. 1, 2012 (Jan. 1, 2012), p. 41-43.

Ji, Dong & Ercan, Burcu & Benson, Garrett & Newaz, Akm & Chowdhury, Srabanti. (May 27, 2020). 60 A/W high voltage GaN avalanche photodiode demonstrating robust avalanche and high gain up to 525 K. Applied Physics Letters. 116. 211102. 10.1063/1.5140005.

Oka, Tohru & Ina, Tsutomu & Ueno, Yukihisa & Nishii, Junya. (2015). 1.8 mΩ-cm 2 vertical GaN-based trench metal-oxide semiconductor field-effect transistors on a free-standing GaN substrate for 1.2-kV-class operation. Applied Physics Express. 8. 054101. 10.7567/APEX.8.054101.

Yonkee, Benjamin & Young, Erin & Denbaars, Steven & Nakamura, Shuji & Speck, James. (Nov. 9, 2016). Silver free III-nitride flip chip light-emitting-diode with wall plug efficiency over 70% utilizing a GaN tunnel junction. Applied Physics Letters. 109. 191104. 10.1063/1.4967501.

* cited by examiner

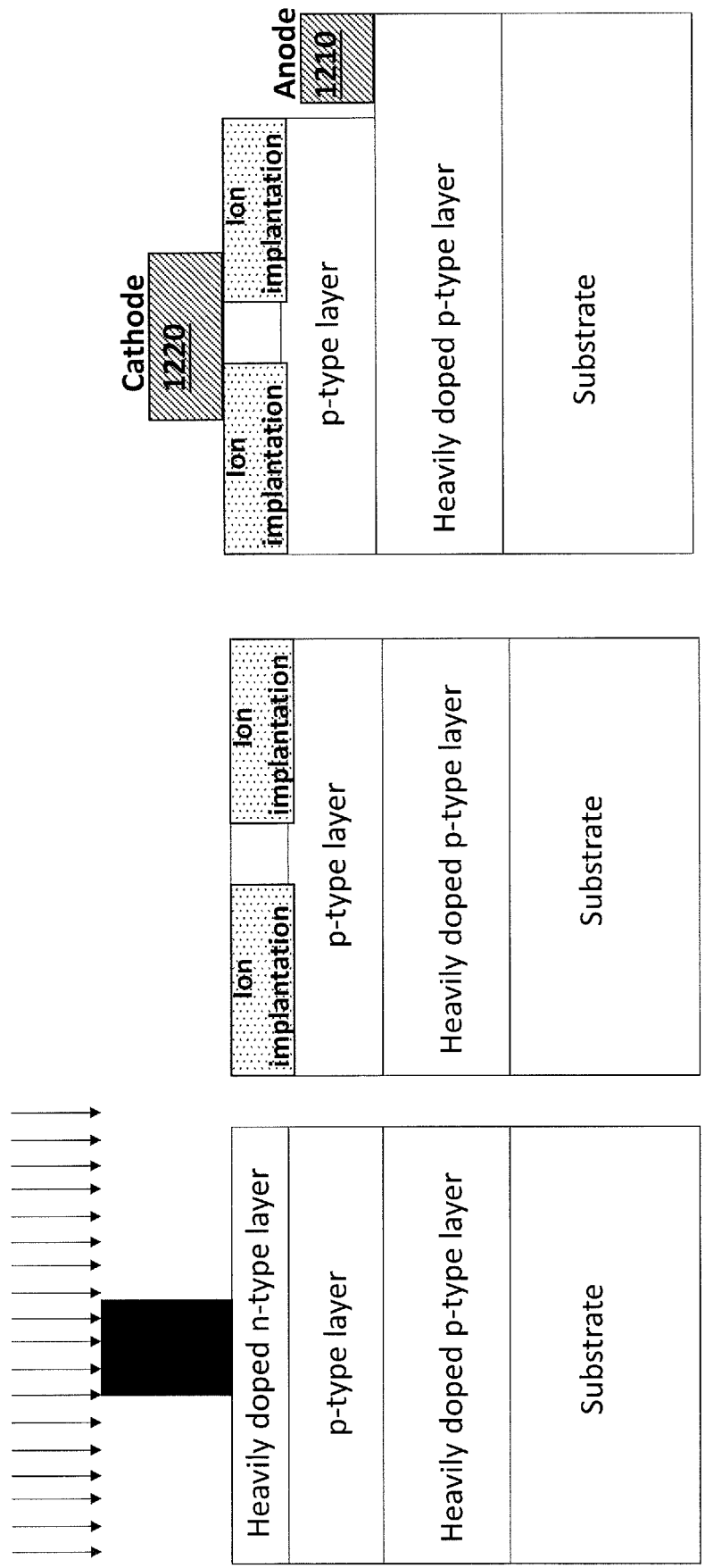

DEVICES AND METHODS INVOLVING ACTIVATION OF BURIED DOPANTS USING ION IMPLANTATION AND POST-IMPLANTATION ANNEALING

FEDERALLY-SPONSORED RESEARCH AND DEVELOPMENT

This invention was made with Government support under contract DE-AR000451 awarded by the U.S. Department of Energy. The Government has certain rights in the invention.

BACKGROUND

Aspects of the present disclosure are related generally to the field of III-Nitride or related devices having a buried p-type (e.g., Mg-) doped epitaxial layer, and as exemplified by vertical III-Nitride electronic devices and transistors, impact ionization Avalanche Transit-Time (IMPATT) diodes, bipolar-junction transistors, light-emitting diodes, and laser diodes.

Using one such technology type for ease of discussion, it has been appreciated that activating a buried magnesium-doped or magnesium-implanted region in Gallium Nitride (GaN) and other III-Nitrides, may be challenging. A lack of activation of magnesium (Mg) limits device design and development at large. This applies to III-Nitride device and or III-V material technologies that may use a p-type region for its functionality. Such a p-type region (obtained by either implantation or doping) does not have an easy reach to the atmosphere. This is sometimes attributable to other (Ga/In/Al)N layers grown/regrown or thick dielectric or insulator being deposited on top of the p-(Ga/In/Al)N layers. Hydrogen bonds with Mg may form a complex that prevents Mg from behaving as an acceptor and doping the p-type semiconductor. When a Mg-doped or implanted (Ga/In/Al)N layer is on the top of the structure, one may drive out the hydrogen by baking or annealing it in air or nitrogen at 700 degrees Celsius. However, if the Mg-doped or implanted Ga(IN, Al)N is buried, annealing may not help. This issue may be important for power electronic devices and technologies other than power electronics, such as RF circuitry and photonics and/or opto-electronic devices.

During metal organic chemical vapor deposition (MOCVD) growth, acceptors in the Mg-doped III-Nitride epitaxial layer may be compensated by the hydrogen in the MOCVD chamber by forming the Mg—H complex. When the Mg-doped III-Nitride epitaxial layer is the cap layer, the hydrogen can be diffused into the atmosphere by thermal treatment. However and as alluded to above, if the Mg-doped III-Nitride epitaxial layer is buried beneath Si-doped or n-type layers, the hydrogen cannot be diffused out due to the barrier created by the top layers. The difficulty of activation of the acceptors in the buried Mg-doped III-Nitride epitaxial layer has impeded the development of both electronic and photonic devices, especially with these devices who need regrowth, such as current aperture vertical electron transistors, metal-oxide-semiconductor field-effect transistor, bipolar junction transistors, light emission diodes, and laser diodes.

One often-used semiconductor material is GaN. GaN has a wide bandgap of 3.4 eV, high breakdown electric field over 3 MV/cm, which enables power switches with high power density by simultaneously enabling high power conversion efficiency and reduced form factor. This is due to the high electron mobilities in the channel and bulk GaN drift region of devices.

GaN has entered the medium-power market in the form of AlGaN/GaN high electron mobility transistor and shown excellent performance. However, for high power conversion applications, devices with vertical geometry are preferred over lateral geometry since the former allows more current for a given chip area, therefore making it a more economical and feasible solution for high voltage and high current applications.

Vertical topologies become more economical and viable for such a range of high power applications. A typical vertical device has a source and gate on the top and the drain on the bottom. One common example is a current aperture vertical electron transistor (CAVET) in which a current blocking layer, which separates the source and drain regions, contains a narrow aperture which is filled with electron conducting material. Source contacts are deposited on either side of the aperture. The drain metal contacts the n-doped region below the aperture. Electrons flow from the source contacts through the aperture into the n-type base region and are collected at the drain. A gate may be located above the aperture, and because the pinched off region is located underneath the gate, charge may not accumulate at the gate edge, thereby mitigating large fields near the gate edge. The current is thereby controlled by the gate and the current flows through the bulk of the material into the drain. The horizontal high-mobility electron channel achieved by the AlGaN/GaN layer is used in conjunction with a thick GaN drift region in order to achieve low $R_{ON}$ and a high breakdown voltage. Current blocking layers (CBL) may be achieved by either p-type doping of the GaN layer or by implantation of material like Mg. In both cases, the devices require an aperture through which the current can flow. The p-type CBL can be activated by using thermal treatment after or post implantation (but which may also occur at least in part during an implantation step). After the CBL formation, channel layers are grown by MOCVD, during the regrowth process, the Mg-doped or Mg-implanted CBL will be deactivated by the formation of Mg—H complex. In the existing technology, after the MOCVD regrowth, a via may be etched to expose part of the buried CBL to the atmosphere, and then the hydrogen can be diffused out through the dry etched via. However, as a consequence, the dry etch-induced damage may impede the formation of ohmic contact between source metal and the CBL.

Another series of vertical III-Nitride transistors are trench gate structure devices, such as trench metal-oxide-semiconductor field-effect transistors (MOSFETs), trench CAVETs, and MOSFETs with regrown channel layers. In these devices, especially trench CAVETs, and trench MOSFETs with regrown channel layers, the Mg-doped p-type base regions or the CBL regions will be deactivated during the MOCVD regrowth due to the existence of hydrogen atmosphere. Using dry etched via to create a path to diffuse out the hydrogen in the buried Mg-doped region can hurt the formation of ohmic contact between source and buried p-type base region or CBL.

In addition to vertical III-Nitride and/or III-V material electronic devices, photonic devices, such as light emitting diodes and laser diodes with regrown layers also use reactivation of the buried p-type layers.

SUMMARY OF VARIOUS ASPECTS AND EXAMPLES

Various examples/embodiments presented by the present disclosure are directed to issues such as those addressed above and/or others which may become apparent from the following disclosure. For example, some of these disclosed aspects are directed to methods and devices that use or leverage from ion implantation to create a path for hydrogen diffusion to activate a buried, doped III-Nitride or III-V material region (e.g. doped such as via implanting with Mg or another p-type dopant), and other aspects are directed to creating a path to diffuse out the hydrogen without damaging the ohmic contact between the source and p-type base or CBL regions. Other aspects are directed to overcoming previously-used techniques, such as discussed above, by avoiding disadvantages such as damages caused by dry etching.

In one specific example, a method involves, a method a semiconductive device having a buried region doped including at least one of or a combination of an unactivated material (e.g., Mg-doped III-Nitride material or III-V material) and including a diffusion path ("ion diffusion path") that has hydrogen introduced by using ion implantation via at least one ion species. A during- and/or post-ion implantation thermal treatment is applied to diffuse out the hydrogen through the ion implanted path and to cause activation of the buried region. In another related example, the use of the ion implantation to create a path for hydrogen diffusion is to activate the buried region, without diffusion of the hydrogen without damaging an ohmic contact region, for example, between a source region for a transistor and the buried region (e.g., p-type base or CBL regions).

In certain other examples which may also build on the above-discussed aspects, methods and semiconductive structures are directed to use of such a buried region doped including p-type doped III-Nitride or III-V material and wherein the ion diffusion path is processed by a during-/post-ion implantation thermal treatment that causes sufficient amounts of the hydrogen to diffuse out through the ion implanted path and thereby cause activation of the buried doped region. In more specific examples in which such semiconductive structures have an ohmic contact region at which a source of a transistor interfaces with the buried region, the ohmic contact region is without etching-based damage due at least in part to the implantation thermal treatment.

In more specific examples related to the above methodology and/or devices, the doped buried region includes GaN alone or GaN in combination with another III-Nitride or III-V material, and the at least one ion species includes at least one or a combination Magnesium (Mg), Palladium (Pd), Platinum (Pt), Aluminum (Al), Nitrogen (N), Argon (Ar), Beryllium (Be), and Helium (He). Further, the ion-implantation thermal treatment may cause hydrogen to diffuse out into an atmosphere surrounding the semiconductive device; the buried region may be a p-type region defined at least in part by a Mg-dopant and/or a material having or characterized by III-Nitride material or III-V material; and/or the ion diffusion path may be created by a selective-area ion implantation.

According to another related aspect, due to the hydrogen in the diffusion path, the buried region doped includes a III-Nitride or III-V material that is not an active p-type semiconductor until after the step of applying a during-/post-ion implantation thermal treatment to diffuse out hydrogen.

In connection with further exemplary aspects, the buried region may refer to or include a current blocking layer (CBL), and the method may further include the step of applying a thermal treatment during and/or after ion implantation to diffuse out hydrogen from the CBL.

In yet another example, an apparatus is directed to a semiconductor structure which may be a semiconductor device or product or a semiconductor structure at an interim stage formed during the manufacture of such a semiconductor device or product. The semiconductor structure comprises: a semiconductive portion having a buried region including at least one of or a combination of p-type (e.g., Mg-) dopant and a material having or characterized by III-Nitride material or III-V material; and a diffusion path ("ion diffusion path") defined by implanted ions via at least one ion species and having hydrogen, and wherein the buried region is activated via application of a thermal treatment (occurring during and/or after ion implantation) to diffuse out hydrogen through the ion implanted path.

In a more specific aspect, the above-characterized semiconductor structure further includes an ohmic contact region at which an ohmic contact region is formed (e.g., where a source of a transistor interfaces with the buried region), and wherein the ohmic contact region is without resultant etching-based damage.

In yet more specific aspects, the above-characterized semiconductor structure are part of one or a combination of the following (without limitation): an avalanche photodiode/device; a III-Nitride light emitting diode; a laser diode; a vertical III-Nitride trench gate device; a GaN-based power transistor device; and a III-Nitride current aperture vertical electron transistor.

The above discussion is not intended to describe each aspect, embodiment or every implementation of the present disclosure. The figures and detailed description that follow also exemplify various embodiments.

BRIEF DESCRIPTION OF FIGURES

Various example embodiments, including experimental examples, may be more completely understood in consideration of the following detailed description in connection with the accompanying drawings, each in accordance with the present disclosure, in which:

FIG. 10 shows an example methodology involving selective area ion implantation using masks formed by photoresist, dielectric or metal stack, according to certain exemplary aspects of the present disclosure;

FIG. 11 shows a cross-section of the structure of FIG. 10, also according to certain exemplary aspects of the present disclosure;

FIG. 12 shows a two terminal device structure fabricated consistent with exemplary aspects of the present disclosure;

Figures 1, 2:
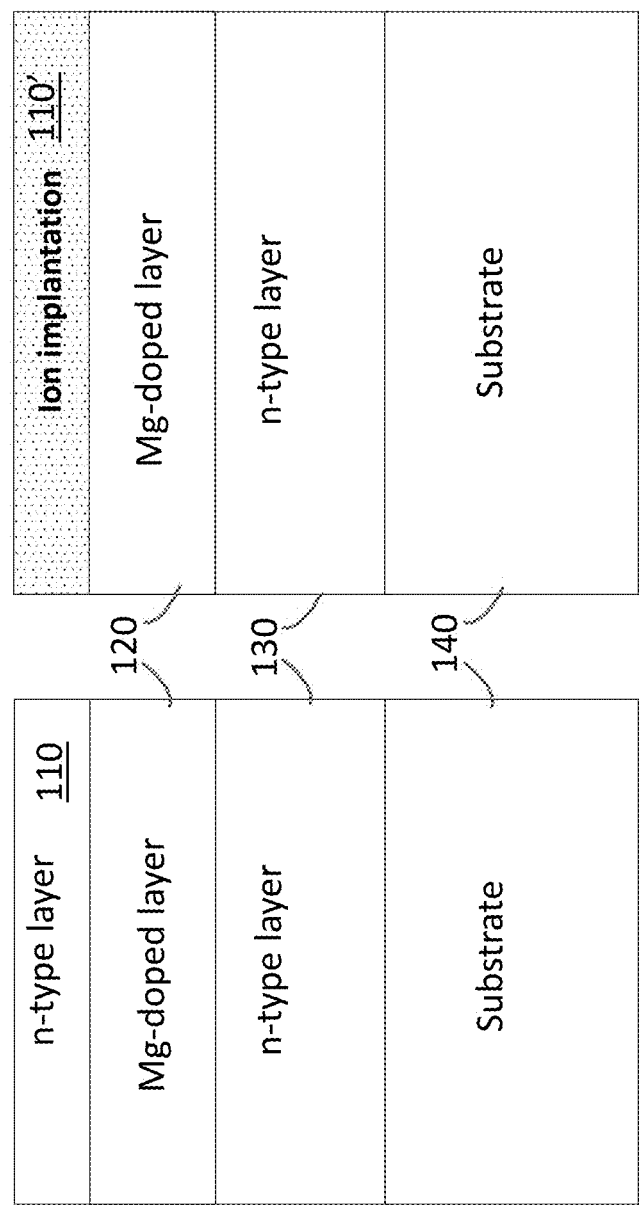
FIG. 1 is a cross-section schematic illustration of epitaxial (III-Nitride or III-V material) layers according to certain exemplary aspects of the present disclosure.
FIG. 2 shows epitaxial structures such as in FIG. 1 but after ion implantation to compensate the top n-type layer, according to exemplary aspects of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving devices characterized at least in part by their use of III-Nitride and/or III-V material, and a buried p-type (e.g., GaN) epitaxial layer. In certain examples, aspects of the present disclosure have been shown to be particularly beneficial when used in the context of activation of a buried p–GaN layer via hydrogen diffusion which, in certain implementations, may be beneficial to avoid disadvantaging the structure such as may otherwise be evident as etching-based damage. While the present disclosure is not necessarily limited to such aspects, an understanding of specific examples in the following description may be understood from discussion in such specific contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Exemplary aspects of the present disclosure are related to III-Nitride and/or III-V material devices, for example, concerning a buried Mg-doped epitaxial layer, and more particularly to vertical (e.g., III-Nitride) electronic transistors, IMPATT diodes, bipolar junction transistors, light emitting diodes, and laser diodes. Certain example aspects involve a method of activating buried p-type or Mg-doped buried (e.g., III-Nitride) regions created by a hydrogen diffusion path by ion implantation and diffusing out hydrogen through the ion-implantation thermal treatment. As examples of various specific aspects, such an apparatus or method involves creating a hydrogen diffusion path by ion implantation. As specific examples, the above-characterized figures are provided to help illustrate certain aspects (and advantages in some instances) which may be used in the manufacture of such devices.

Consistent with the above aspects, such a manufactured device or method of such manufacture may involve aspects presented and claimed in one or both of the provisional applications (U.S. Provisionals, Application Ser. No. 62/848,974 filed on May 16, 2019; and Application Ser. No. 62/915,488 filed on Oct. 15, 2019, to which priority is claimed). To the extent permitted, such subject matter is incorporated by reference in its entirety generally and to the extent that further aspects and examples (such as experimental and/more-detailed embodiments) may be useful to supplement and/or clarify.

Consistent with the present disclosure, such devices and/or methods may be used for producing (among other examples disclosed herein) Vertical GaN transistors, such as CAVETs, MOSFETs, JFETs, and avalanche photodiodes/devices, any of which may (optionally) include a buried (e.g., Mg-doped) current blocking region or base region. Photonic devices, such as laser diodes and light emitting diodes, may also include multiple p-n structures with buried p-type regions.

As noted above, certain exemplary aspects of the present disclosure involve methodology and structures directed to activation of one or more buried (e.g., Mg-) doped III-Nitride layers using ion implantation and a post-implantation thermal treatment (but the thermal treatment may also occur at least in part during an ion implantation step). This may be done to avoid the resultant etch damage caused by often-used dry etch methodology (such as when forming a trench where a contact region may reside).

According to certain specific examples, the present disclosure is directed to a method and alternatively, a device manufactured from the method involving a semiconductive structure or device having a buried region including at least one of or a combination of at least one p-type dopants in a material having at least one III-Nitride material and/or at least one III-V material. A diffusion path ("ion diffusion path") is created that includes hydrogen by using ion implantation via at least one ion species, and in response, an ion implantation thermal treatment is applied thereto in order to diffuse out hydrogen through the ion implanted path and to cause activation of the buried region.

In certain of these examples, due to the hydrogen in the diffusion path, the buried region doped with a III-Nitride material is not an active p-type semiconductor until after the step of applying a during- and/or post-ion implantation thermal treatment to diffuse out hydrogen.

Also according to the present disclosure, the above method and/or device may have the buried region including GaN alone or GaN in combination with another III-Nitride or III-V material; and wherein the at least one ion species includes at least one or a combination Magnesium (Mg), Palladium (Pd), Platinum (Pt), and Aluminum (Al). Further, method and/or device may have the ion implantation thermal treatment to diffuse out hydrogen causes hydrogen to diffuse into an atmosphere surrounding the semiconductive device. Yet further, the buried region may be a p-type region defined by Mg-doped III-Nitride (and/or III-V material), and the ion diffusion path may be created by a selective-area ion implantation, and also optionally with the ion implantation thermal treatment diffusing out hydrogen from the p-type region defined by the Mg-doped III-Nitride.

The above step of creating a path to diffuse out the hydrogen, in certain examples, is effective to mitigate or avoid damaging a region where an ohmic contact may exist.

The step of creating a diffusion path may include using p-type dopant implantation, and wherein the buried region includes a p-type GaN material or p-type GaN layer, and one or more ion implantation steps may be performed to provide isolation and/or edge termination.

In yet further examples relating to the above aspects of the present disclosure, the buried region may include a current blocking layer (CBL). In such examples, the method may further include the step of applying during-/post-ion implantation thermal treatment to diffuse out hydrogen from the CBL. Further, with the semiconductive device including a current blocking layer (CBL), the diffusion path may be a channel created by using MOCVD regrown layers, and wherein the step of applying an ion implantation thermal treatment is to diffuse out hydrogen from the CBL. Such CBL-type examples may also include the step of applying an ion implantation thermal treatment is to diffuse out hydrogen from the CBL, and forming a source-to-CBL-ohmic contact region without resultant damaging (or mitigating damage to) the source-to-CBL-ohmic contact.

In other CBL-related examples involving a semiconductive device having a p-type dopant in a III-Nitride material (or III-V material), and using ion implantation and a during-/post-post-ion implantation annealing step, methodology is directed towards manufacture of a product (or interim structure at a stage before finalizing the product during manufacture) may involve: forming a channel and creating a hydrogen diffusion path towards the CBL by ion implantation; applying a thermal treatment (during and/or after ion implantation) to diffuse out hydrogen from the CBL; and forming a source-to-CBL-ohmic contact using ion implantation. The CBL (whether a layer in one sense or in another context being a region such as a region of a layer) may be a p-type region defined in part by including a p-type dopant and a III-Nitride (and/or in some instances, a III-V material). The ion diffusion path may be created by a selective-area ion implantation, and the ion implantation thermal treatment diffuses out hydrogen from the p-type region.

Using such manufacture-related methodology, various semiconductor structures and/or devices may be characterized as including a semiconductive portion having a buried region including at least one of or a combination of p-type dopant and a III-Nitride and/or III-V material, and also including an ion diffusion path defined by implanted ions via at least one ion species and having hydrogen, and wherein the buried region is activated via application of an ion implantation thermal treatment to diffuse out hydrogen through the ion implanted path. Further, the semiconductor structure may further include an ohmic contact region at which a source of a transistor interfaces with the buried region, and wherein the ohmic contact region is without resultant etching-based damage due at least in part to the ion implantation thermal treatment.

Various experimental examples, some of which are discussed hereinbelow, have demonstrated that the above-characterized aspects, structures and methodologies may be used in one or more semiconductive devices to form semiconductor circuits and devices including but not limited to one or a combination of: an avalanche photodiode/device; a III-Nitride light emitting diode; a laser diode; a vertical III-Nitride trench gate device; a GaN-based power transistor device; a III-Nitride current aperture vertical electron transistor; impact ionization Avalanche Transit-Time (IMPATT) diode; and a bipolar-junction transistor.

Before turning to the drawing to be discussed in detail below, it is noted that each of the above (briefly-described) examples are presented in part to illustrate aspects of the present disclosure, as might be recognize by the foregoing discussion. As further examples, such aspects may include: forming a channel by using MOCVD regrown layers, using Mg-ion implantation (e.g., without damaging the source-to-CBL-ohmic contact), and/or the CBL being associated with a buried region doped with a III-Nitride or III-V material that may include for example, GaN alone or GaN in combination with another III-Nitride or III-V material. With such aspects, various devices (e.g., a transistor) may be formed so that the semiconductor device has a source-to-CBL ohmic contact formed in part by using Mg-ion implantation.

FIG. 1 is a cross-section schematic, example illustration of epitaxial III-Nitride (or III-V material) layers grown by MOCVD on the homogenous substrate. The cap n-type layer 110 may be in situ grown with the Mg-doped layer, or ex-situ grown (also called "regrown") on top of the next layer which in this example is Mg-doped layer 120 which may be thicker (e.g., 300-nm thick) than the cap n-type layer 110 (e.g., 200-nm thick). In this manner, the layer 120 is a buried layer or region beneath the cap n-type layer 110 and above another layer 130 and over a substrate 140. Due to the existence of hydrogen, the Mg-doped layer 120 is not an active p-type semiconductor. The hydrogen cannot diffuse into the Si-doped III-Nitride layers, therefore, the n-type cap layer stops the diffusion of hydrogen in the buried Mg-doped layer. In order to activate the Mg-doped III-Nitride layer, a hydrogen diffusion path may be created according to the present disclosure.

In one specific example, such a hydrogen diffusion path may be created by ion implantation. This is shown in FIG. 2, which corresponds to the structure of FIG. 1 after the ion implantation and with the layer 110 of FIG. 1 being shown as layer 110'. FIG. 2 thus shows example epitaxial structures after ion implantation to compensate the top n-type layer. This implantation may be, for example, blanket implantation or selective area implantation using masks formed by photoresist, dielectric or metal stack. As one specific example, double-energy Mg ion implantation (Energy 1=50 keV, dose 1=$3\times10^{14}$ cm$^{-2}$; Energy 2=190 keV, dose 2=$1\times10^{15}$ cm$^{-2}$) may create a 200-nm deep implanted region. The ion implanted region is no longer n-type.

Figure 3:
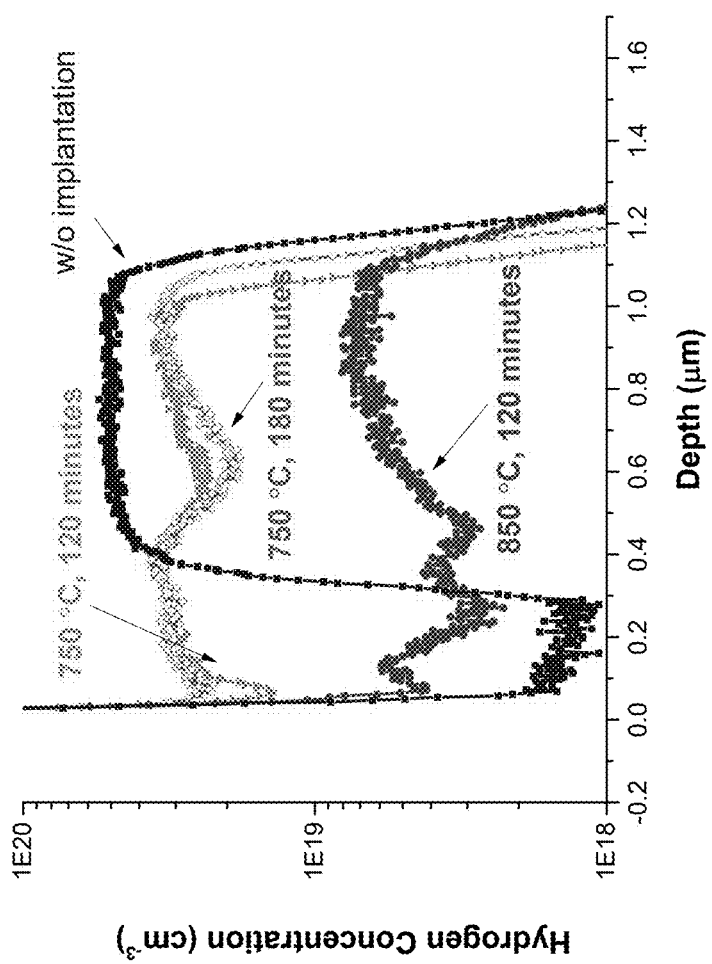
FIG. 3 is a graph showing a comparison of hydrogen concentrations in exemplary epitaxial (III-Nitride or III-V material) layers with and without ion implantation plus the post-implantation thermal treatment, in accordance with examples of the present disclosure.

During and/or after ion implantation such as shown with FIG. 2, thermal annealing may be implemented. Various annealing temperatures and annealing times may be used. Then, the hydrogen concentration is detected using the secondary ion mass spectrometry, as shown in FIG. 3. More specifically, FIG. 3 shows a comparison of example hydrogen concentrations in the epitaxial III-Nitride layers with and without ion implantation plus the ion-implantation thermal treatment. For the structure without ion implantation, the peak hydrogen density is about $5\times10^{19}$ cm$^{-3}$. For the ion-implanted sample, during the post-implantation thermal treatment, the hydrogen diffused toward the top surface of the structure. Under a temperature of 850 degrees Celsius, the more than 90 percent hydrogen can be diffused out after two hours of thermal treatment.

In this example illustration of FIG. 3, the sample without ion implantation may be set as the reference, where the hydrogen concentration in the buried Mg-doped layer is as high as $5\times10^{19}$ cm$^{-3}$. Under an annealing temperature of 750 degrees Celsius, hydrogen diffuses into the ion implanted region. However, the hydrogen still remains a high concentration of $3\times10^{19}$ cm$^{-3}$. Under an annealing temperature of 850 Celsius for 30 minutes, the hydrogen concentration may be reduced to ~$5\times10^{18}$, which is only 10 percent of the original hydrogen concentration. The results in FIG. 3 demonstrate that the ion implantation can help the hydrogen diffuse out effectively.

Figure 4:
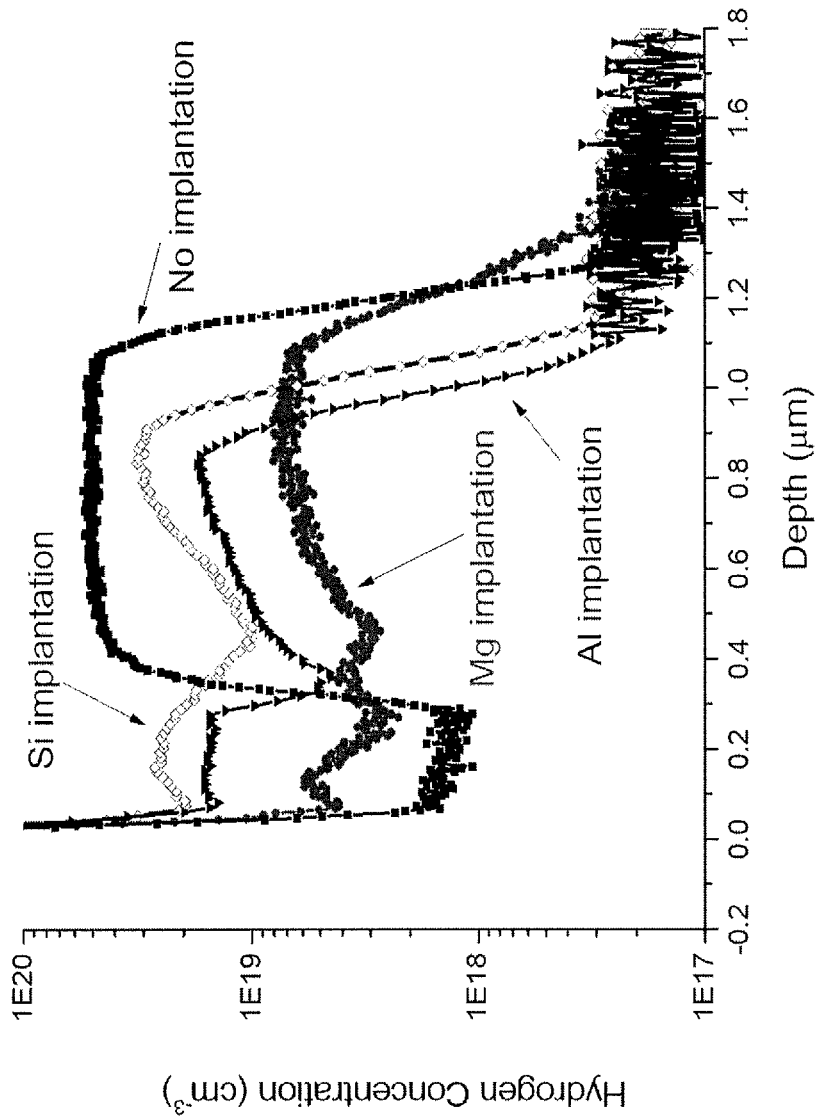
FIG. 4 is a graph showing a comparison of hydrogen concentrations in the epitaxial (III-Nitride or III-V material) layers using different ion species, according to certain exemplary aspects of the present disclosure.

In connection with another related experimental example, FIG. 4 shows a comparison of hydrogen concentrations in the epitaxial III-Nitride layers using different ion species, donor ions (Si), acceptor ions (Mg), and neutral ions (Al), for implantation. In connection with the present disclosure, it has been found/discovered that the implantation regions created by different ions can lower the hydrogen concentration. However, the acceptor ions may have the best effect to reduce hydrogen concentration. With the example of FIG. 4, multiple ion species were implanted. FIG. 4 shows the hydrogen concentration after ion implantation with different ion species of Si, Al, and Mg. All of the samples went through the same thermal treatment (850 degrees Celsius, 30 minutes). It is found that the sample with Mg ion implantation has the lowest hydrogen concentration. Although both Si and Al ions may reduce the hydrogen, the remaining hydrogen concentrations were still relatively high.

Figure 5:
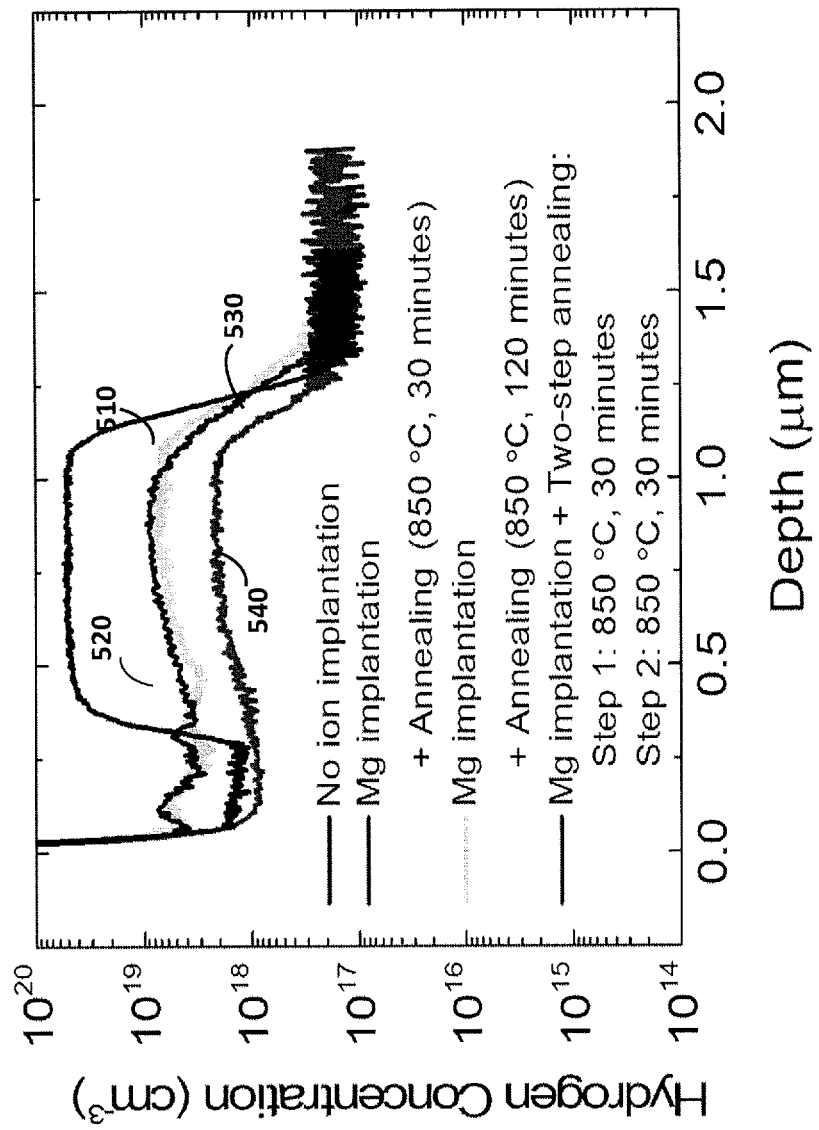
FIG. 5 is a graph showing a comparison of hydrogen concentration in Mg-implanted samples after different annealing conditions, according to certain exemplary aspects of the present disclosure.

FIG. 5 shows the hydrogen concentration in Mg-implanted samples under different thermal annealing conditions via plot lines 510 (no implantation), 520 (Mg implantation plus annealing for 30 minutes), 530 (Mg implantation plus annealing for 120 minutes) and 540 (Mg implantation plus two-step annealing). Under 850 degrees Celsius, more than 90 percent of hydrogen ions were diffused out in 30 minutes, and the hydrogen concentration remained constant when increasing the annealing time up to 120 minutes. By using a two-step annealing method (plot line 540), the sample was first annealed under 850 degrees Celsius for 30 minutes, after which the sample was cooled down to the room temperature, and the sample was then annealed under 850 degrees Celsius for another 30 minutes. From the result shown in FIG. 5, much lower remaining hydrogen concentration was observed in the sample after two-step thermal annealing, each at 850 degrees Celsius for 30 minutes. The remaining hydrogen concentration may be as low as only 4 percent of the original concentration.

Figure 6:
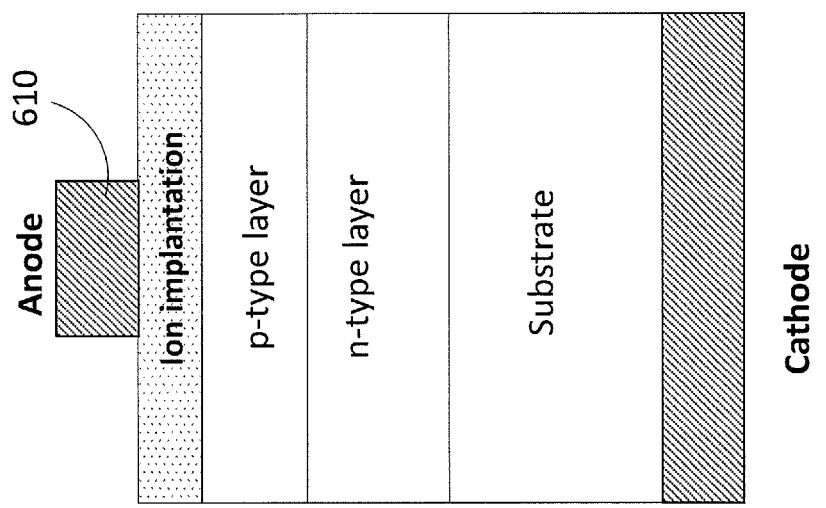
FIG. 6 shows two-terminal devices fabricated based on the epitaxial structure shown in FIG. 2, also according to certain exemplary aspects of the present disclosure.

As another experimental example, FIG. 6 shows two-terminal devices fabricated based on the exemplary epitaxial structure shown in FIG. 2. Before metal electrode depositions, the post-ion implantation thermal anneal was performed. A device on a non-implanted sample was also fabricated as the reference.

Figure 7:
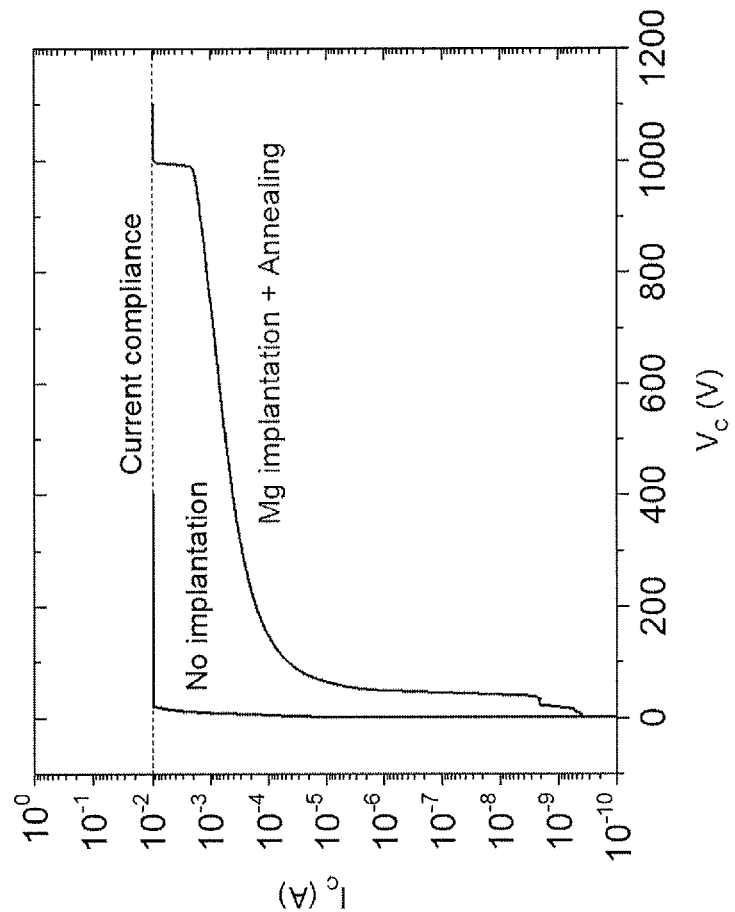
FIG. 7 is a graph showing a comparison of the blocking capability of the two-terminal devices with and without ion implantation plus post-implantation thermal treatment, according to certain exemplary aspects of the present disclosure.

FIG. 7 shows a comparison of the reverse bias characteristics of the two-terminal devices shown in FIG. 6, also according to the present disclosure. For the reference device, the blocking voltage was less than 30 Volts, because the Mg ions in the buried p-type III-Nitride region were inactivated by the hydrogen. With the help of ion implantation plus the post-implantation thermal anneal, the device showed high breakdown voltage approaching 1 kV, indicating a peak breakdown electric field about 2 MV/cm. The results shown in this figure indicate that the ion implantation plus thermal treatment can diffuse out the hydrogen in the buried Mg-doped III-Nitride semiconductor, and as a result, the Mg-doped layer can be reactivated.

Figure 8:
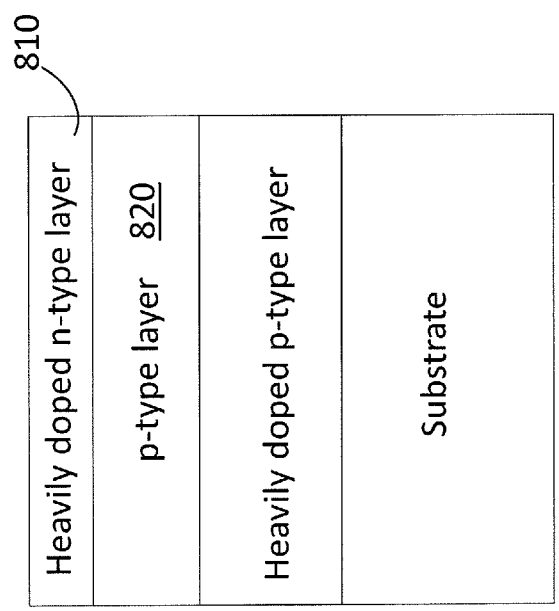
FIG. 8 shows an epitaxial structure with a lightly-doped (Mg) layer buried by the heavily-doped n-type layer, according to yet further exemplary aspects of the present disclosure.

To investigate the reactivation of buried p–GaN using example aspects of the present disclosure, an epitaxial structure with lightly-doped (Mg or p-type) layer 820 buried by the heavily-doped n-type layer 810 was grown by MOCVD on homogeneous substrates, as shown in FIG. 8. This structure includes a heavily-doped n-type layer 810 on top of the lightly Mg-doped layer and heavily Mg-doped layer on foreign or homogenous substrates. The lightly Mg-doped layer was designed for the drift region to block the high voltage. During the material epitaxial growth, both lightly Mg-doped layer and the heavily Mg-doped layer were compensated by hydrogen.

Figure 9:
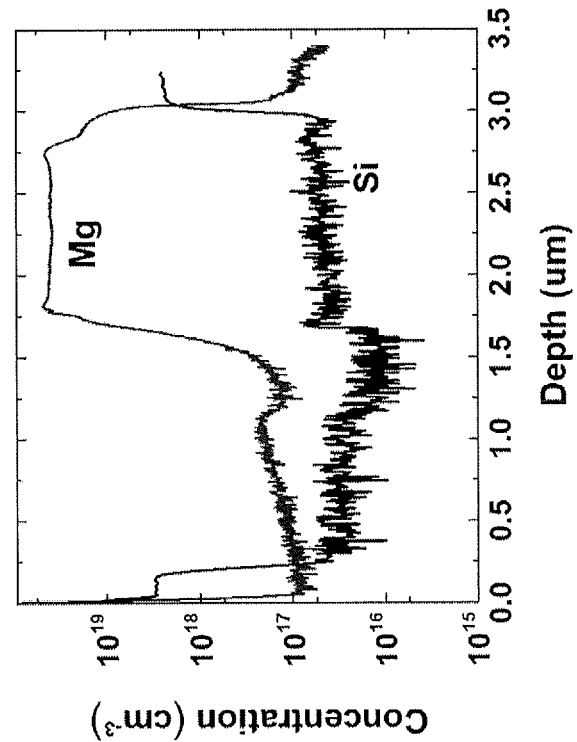
FIG. 9 shows plots of a secondary ion mass spectrometry (SIMS) analysis of the Si and Mg concentration in the epitaxial structure shown in FIG. 8, also according to certain exemplary aspects of the present disclosure.

As noted above, FIG. 9 shows plots of a secondary ion mass spectrometry (SIMS) analysis of the Si and Mg concentration in the epitaxial structure shown in FIG. 8, also according to certain exemplary aspects of the present disclosure. The Si and Mg ion doping concentration is shown in FIG. 9.

FIGS. 10, 11 and 12 may be used to show methods involving selective area ion implantation using masks formed by photoresist, dielectric or metal stack (as in FIG. 10) and with FIG. 11 showing a cross-section of the structure of FIG. 10 after selective area ion implantation. A post-implantation thermal treatment may be done on the sample, also according to certain exemplary aspects of the present disclosure. In such experimentation, the post-implantation thermal treatment was done on the sample at 850 Celsius, 60 minutes.

FIG. 12 shows a two terminal device structure, having an anode 1210 and a cathode 1220, fabricated consistent with exemplary aspects of the present disclosure such as in accordance with the structures and methodology depicted in connection with FIGS. 10 and 11.

Accordingly, using this same experimental effort, selective-area ion implantation may be performed on such a sample via ion implantation masking such as may be created by photoresist, dielectric or metal stacks. After the ion implantation, such a mask may be removed using wet or dry etch, and the sample cleaned (e.g., using piranha solution, which is a mixture of sulfuric acid and hydrogen peroxide, or using another technique).

Figure 13:
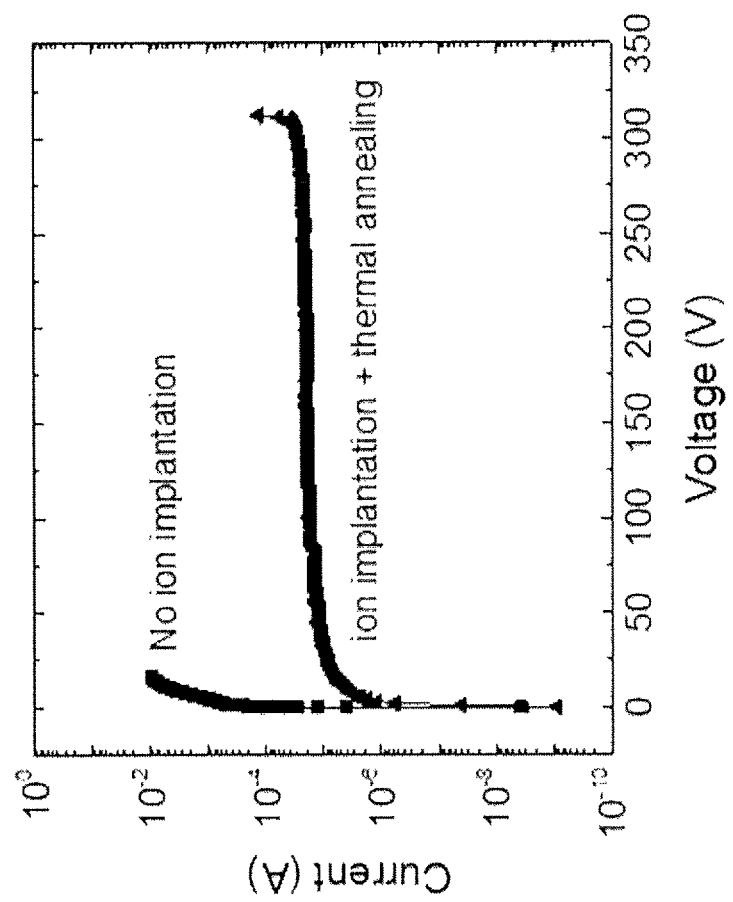
FIG. 13 shows reverse bias characteristics of a two-terminal device with and without ion implantation plus the thermal annealing, according to certain exemplary aspects of the present disclosure.

FIG. 13 shows the reverse bias characteristics of such a two-terminal device (as in FIG. 10) with and without ion implantation plus the thermal annealing. For the device without ion implantation, the Mg dopants are deactivated by the hydrogen, and the device shows no blocking capability (there was no voltage blocking capability because of the Mg dopants are deactivated by the hydrogen). While, with the help of ion implantation plus the post-implantation thermal annealing, the majority of the hydrogen ions are diffused out and the device exhibits high blocking capability with a breakdown voltage over 310 V, which corresponds to a breakdown electric field over 2.6 MV/cm and which may approach or approximate the material limit.

While the experimental results shown in connection FIGS. 5, 7 and 13 demonstrate the effective activation of buried p-type III-Nitride layers using aspects of the present disclosure, further specific experimental examples are discussed below.

Figure 14C:
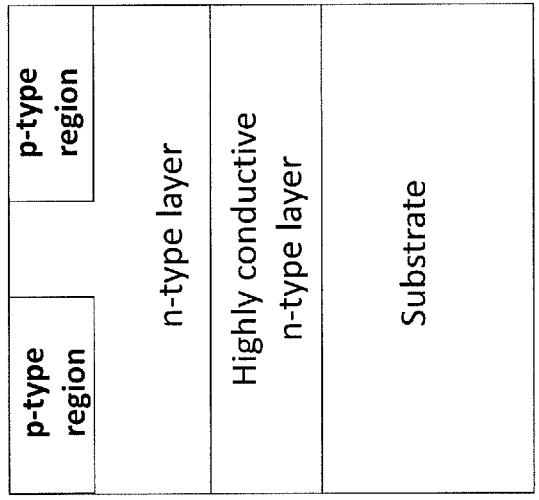
FIGS. 14A, 14B, 14C, 14D, 14E, 14F, 14G, 14H and 14I show an example process of a current aperture vertical electron transistor with ion implanted CBL, according to certain exemplary aspects of the present disclosure.
Figure 14B:
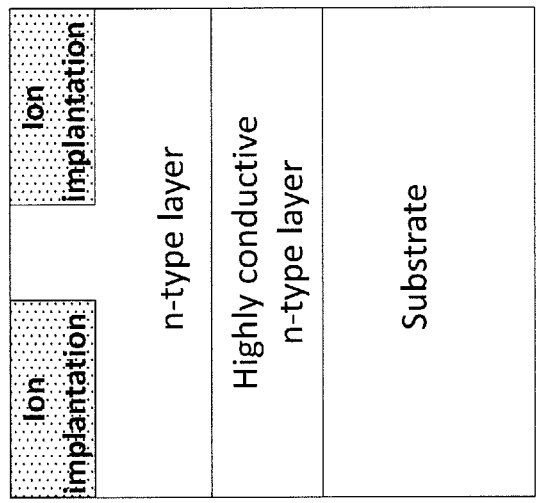
Figure 14A:
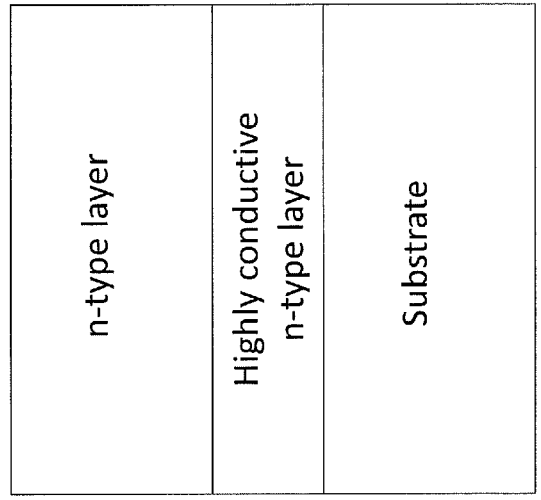
Figure 14E:
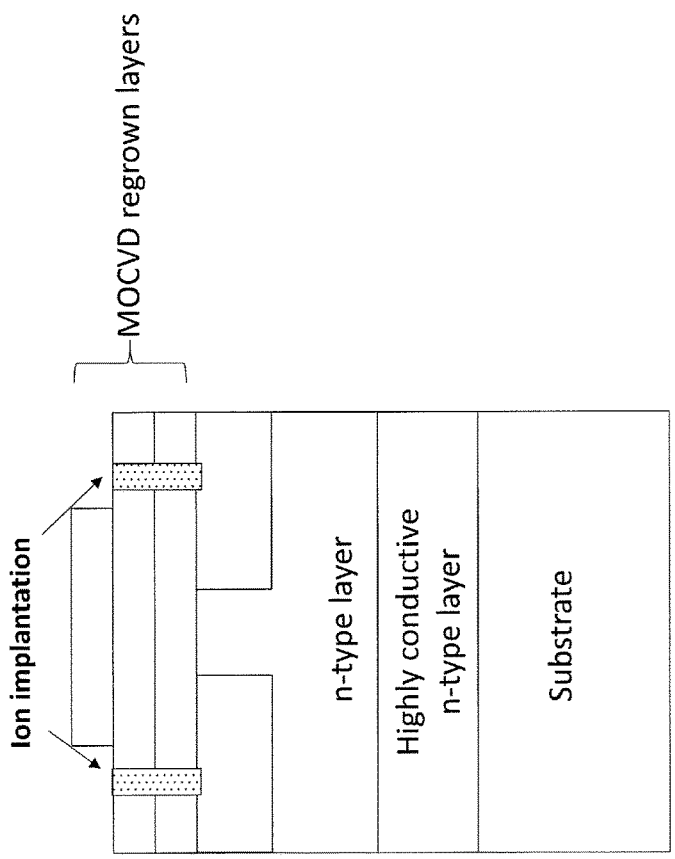
Figure 14D:
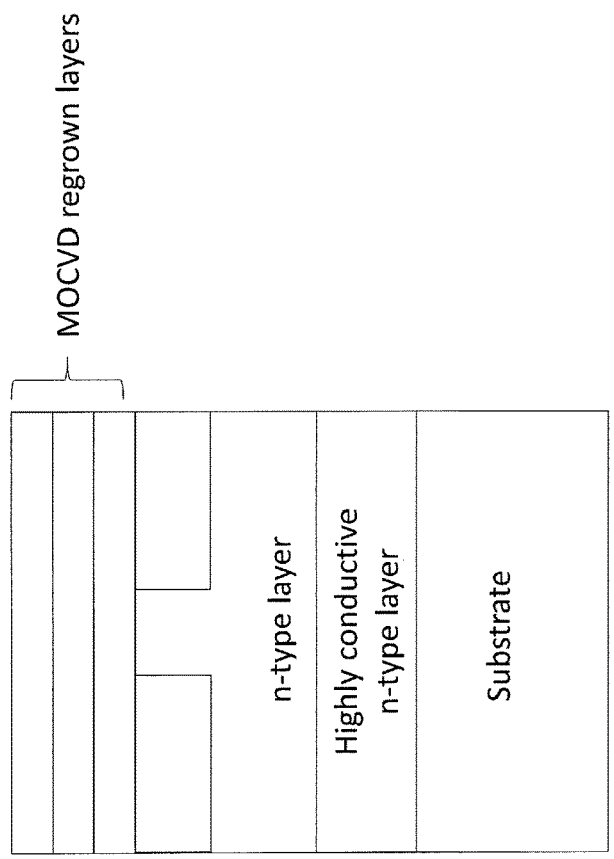
Figure 14F:
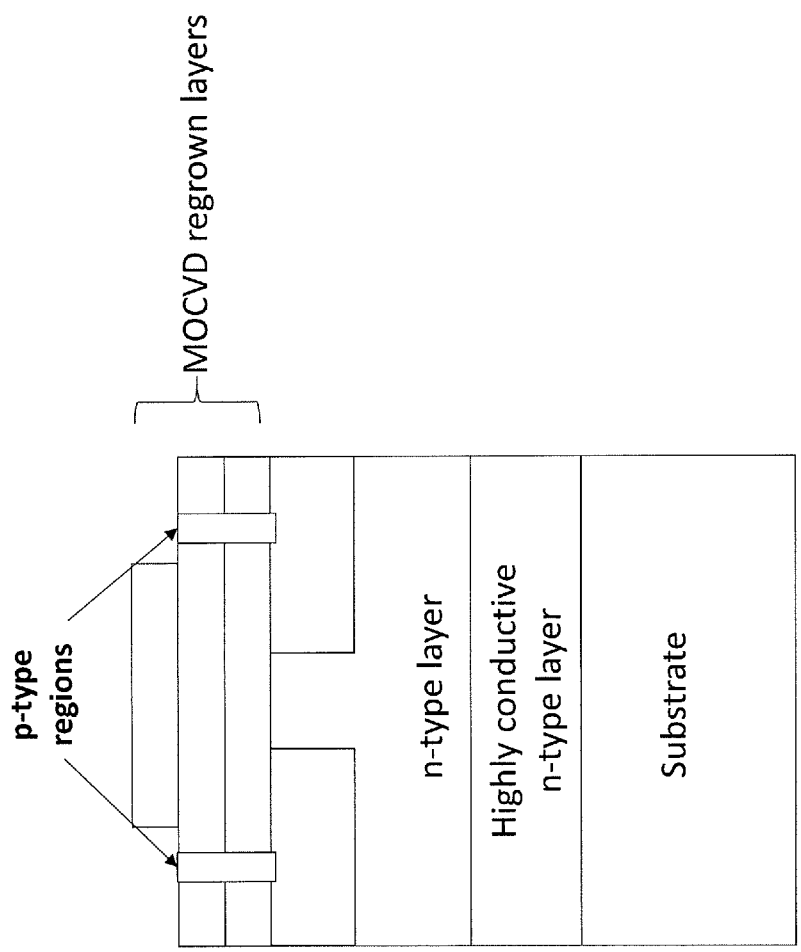
Figure 14G:
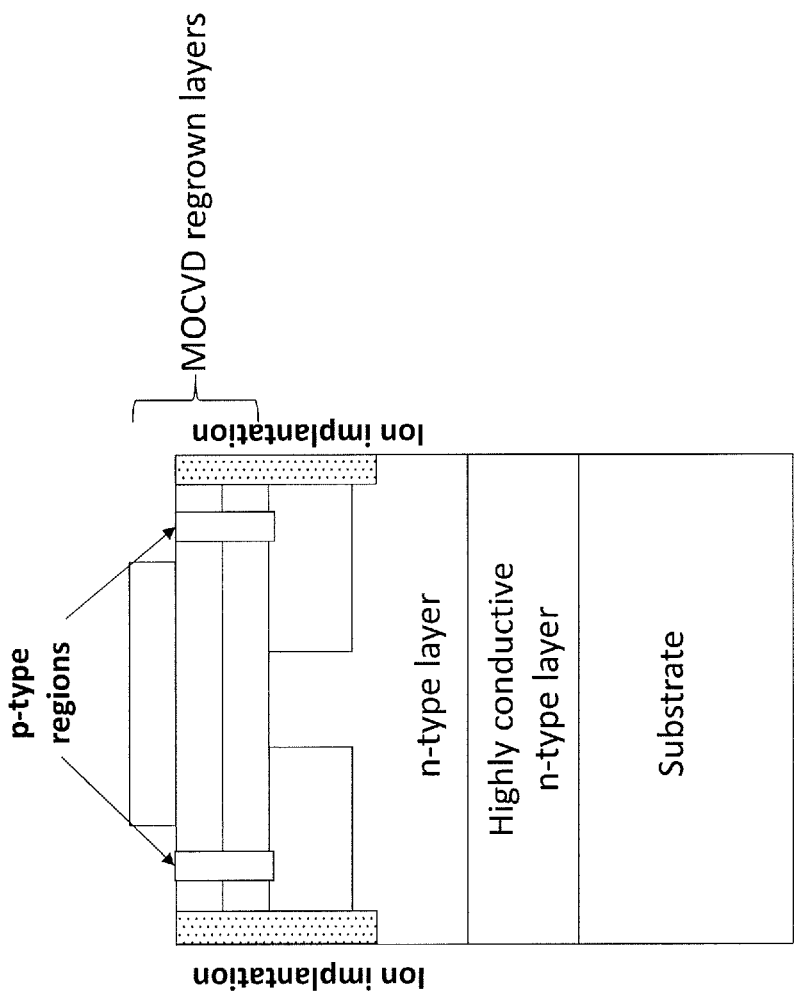
Figure 14H:
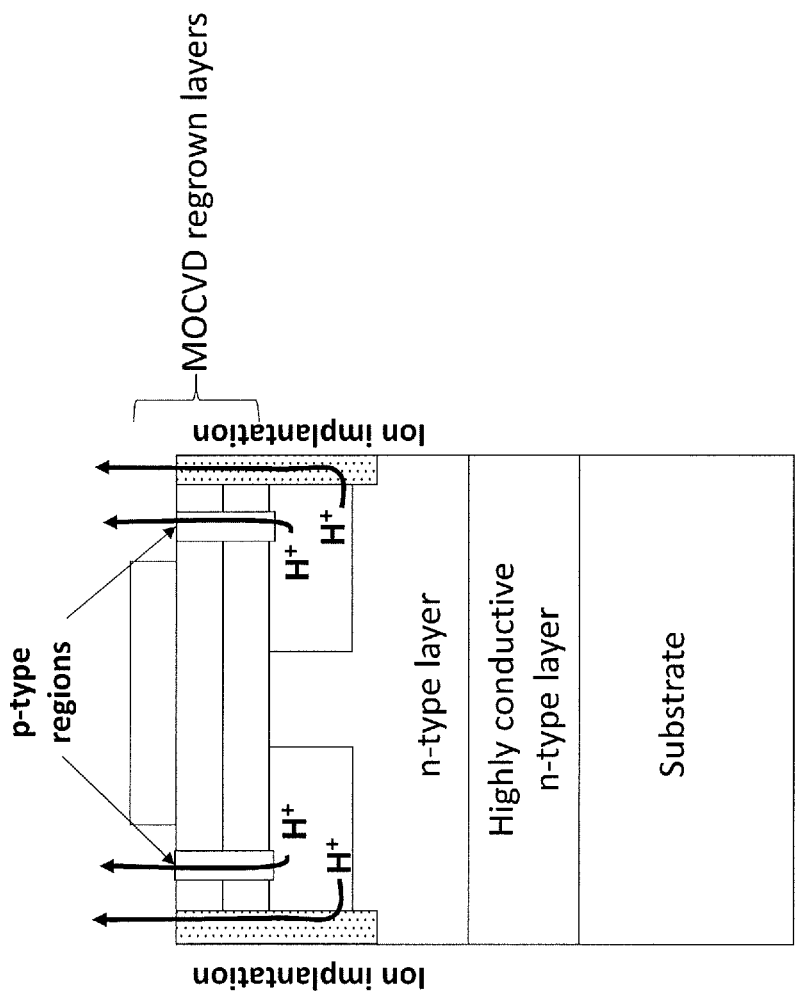

Specific Example 1. Current Aperture Vertical Electron Transistor using ion implanted CBL. The process of fabricating a current aperture vertical electron transistor is shown in FIG. 14A-FIG. 14I. The process begins with the MOCVD growth of the n-type layer with lightly Si-doped drift region on top of the heavily Si-doped n-type layer on a homogeneous substrate (FIG. 14A). The CBL is formed by selective-area ion implantation (FIG. 14B). Post-implantation annealing (as well as annealing during ion implantation) can activate the ion-implanted CBL to p-type region. Channel layers and/or gate dielectric layers are regrown by MOCVD. During the MOCVD regrowth, the buried p-type CBL is deactivated due to the existence of hydrogen. The second selective-area ion implantation is performed. The implanted region connects the atmosphere to the buried CBL. Ion-implantation annealing is used to activate the ion implanted region to p-type. The third selective-area ion implantation can be used for device isolation and/or edge termination, as shown in FIG. 14G. The hydrogen in the buried CBL can be diffused out through both the second ion implanted region and the third ion implanted region during the thermal treatment, as shown in FIG. 14H.

Figure 14I:
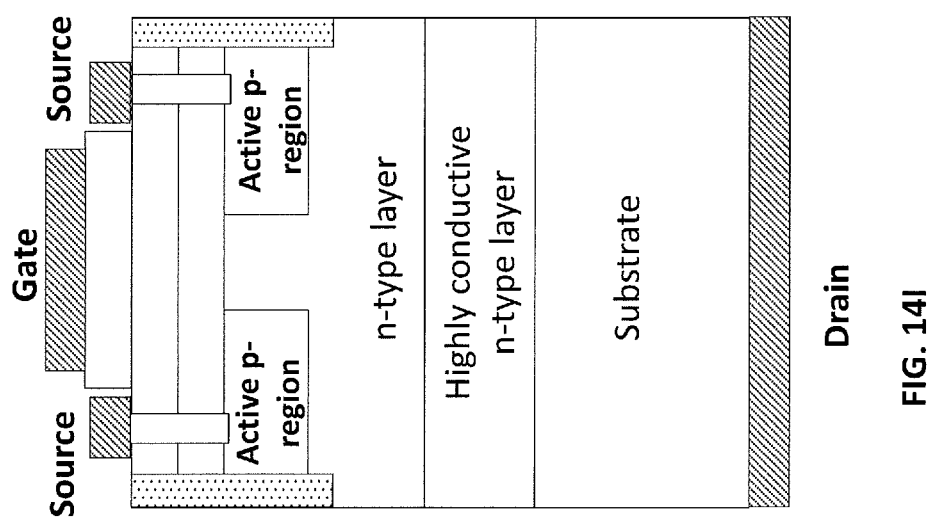
Figure 15C:
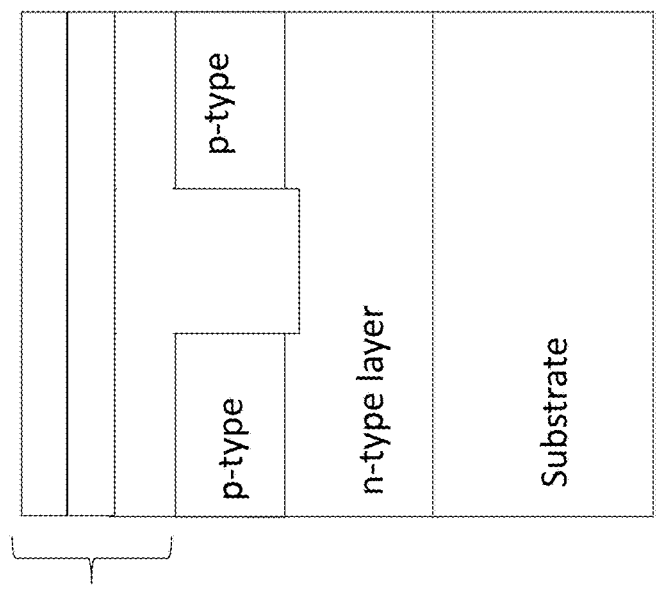
FIGS. 15A, 15B, 15C, 15D and 15E show an example process of a current aperture vertical electron transistor using Mg-doped CBL, according to certain exemplary aspects of the present disclosure.
Figure 15B:
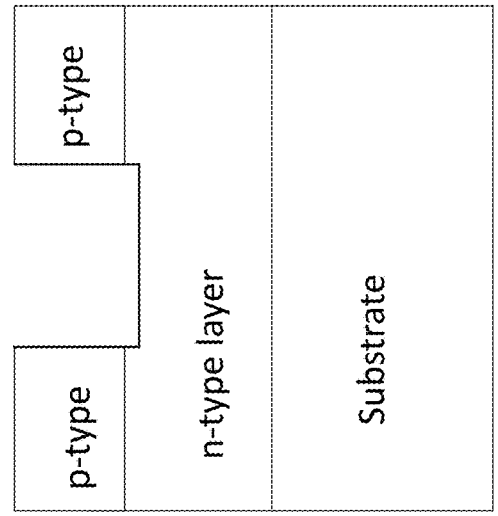
Figure 15A:
Figure 15E:
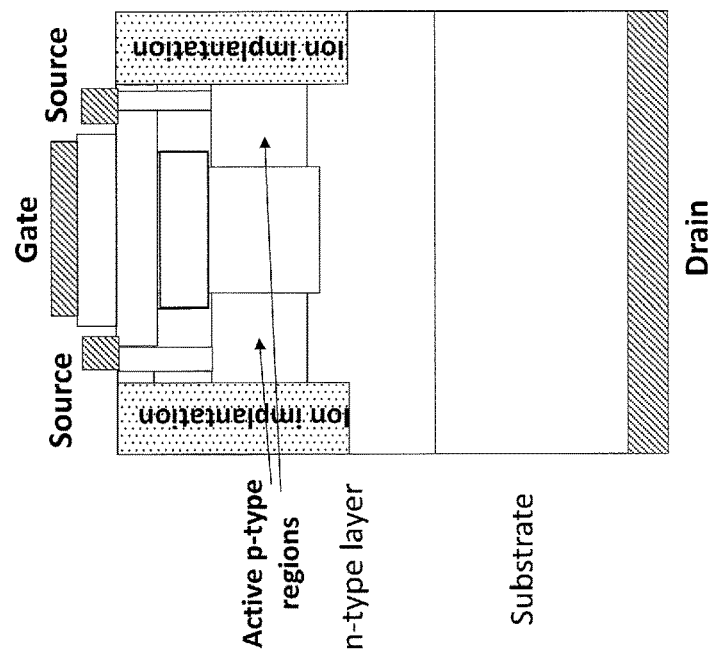
Figure 15D:
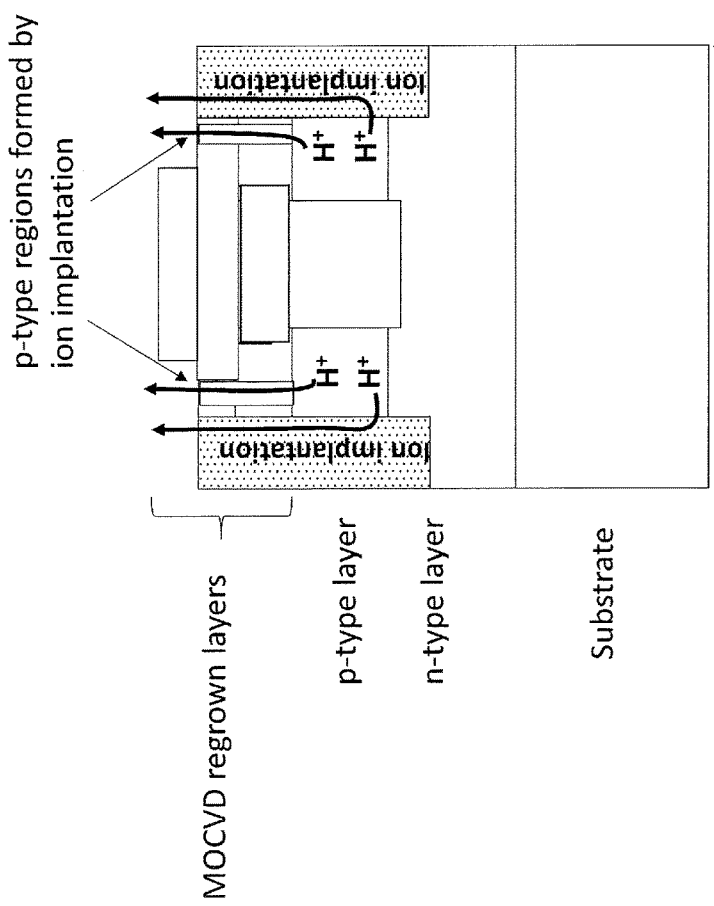

FIG. 14I shows the cross-sectional profile of the full device. The source-to-CBL ohmic contact is formed by the source metal to the (second) ion implanted region below the source metal.

Specific Example 2. Current Aperture Vertical Electron Transistor with Mg-doped CBL. The process of fabricating a current aperture vertical electron transistor with Mg-doped CBLs is shown in FIGS. 15A-E. The process begins with MOCVD growth of the p-type/n-type structures with a lightly Si-doped drift region on top of the homogeneous substrate as in FIG. 15A. The Mg-doped p-type layer is used for CBL as in FIG. 15A. A trench is etched in the aperture region by dry etch or wet etch method as in FIG. 15B. The sample then is sent to the MOCVD chamber to grow the n-type region to refill the etched aperture, and the top channel layers as well as in FIG. 15C. The first selective area ion implantation is performed to connect the atmosphere to the CBL as in FIG. 15D. Post-implantation high-temperature annealing may be used to activate the implanted ions and mitigate/eliminate the damage as may be observed after such annealing. Second ion implantation may be performed as device isolation and/or edge terminations. The hydrogen in the buried CBL can be diffused out through both the first ion implanted region and the second ion implanted region during the thermal treatment, as shown in as in FIG. 15E which shows the cross-sectional profile of the full device. The source-to-CBL ohmic contact is formed by the source metal to the (second) ion implanted region, under the source metal in FIGS. 15D and 15E.

Figure 16C:
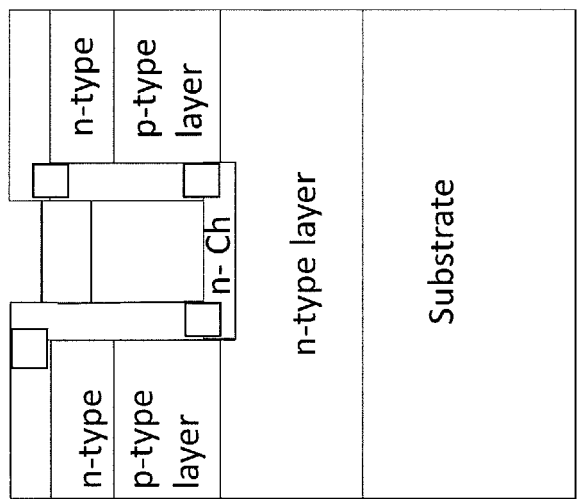
FIGS. 16A, 16B, 16C, 16D, 16E, 16F, 16G, and 16H show an example process of the vertical trench gate devices . . . according to certain exemplary aspects of the present disclosure.
Figure 16B:
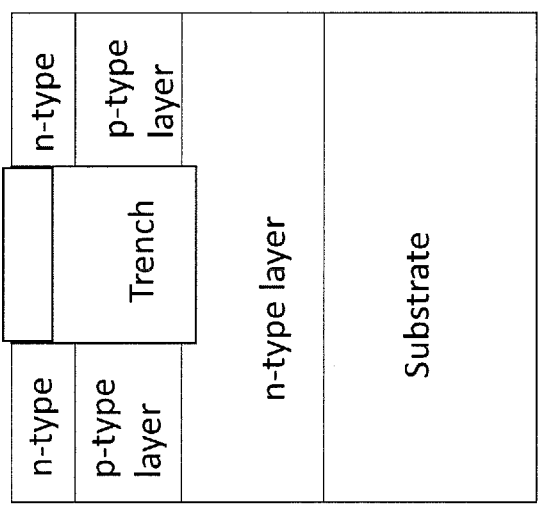
Figure 16A:
Figure 16E:
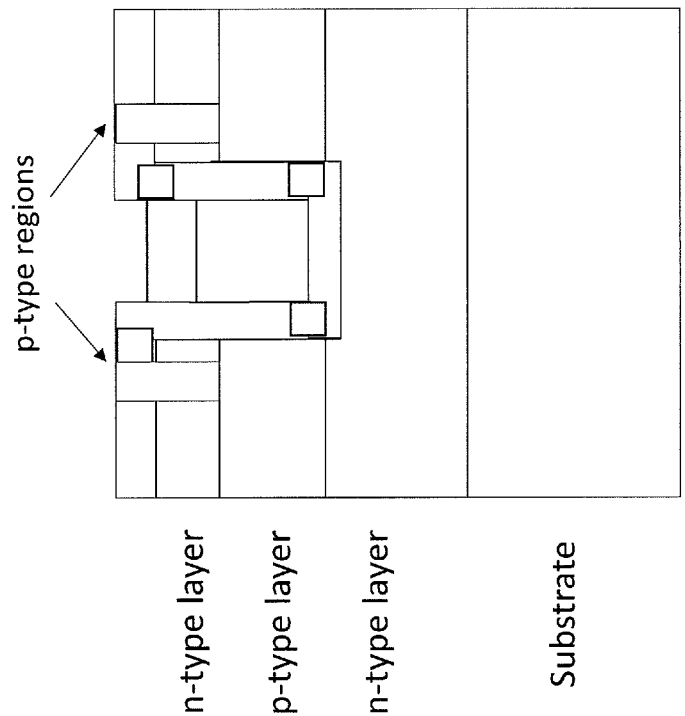
Figure 16D:
Figure 16F:
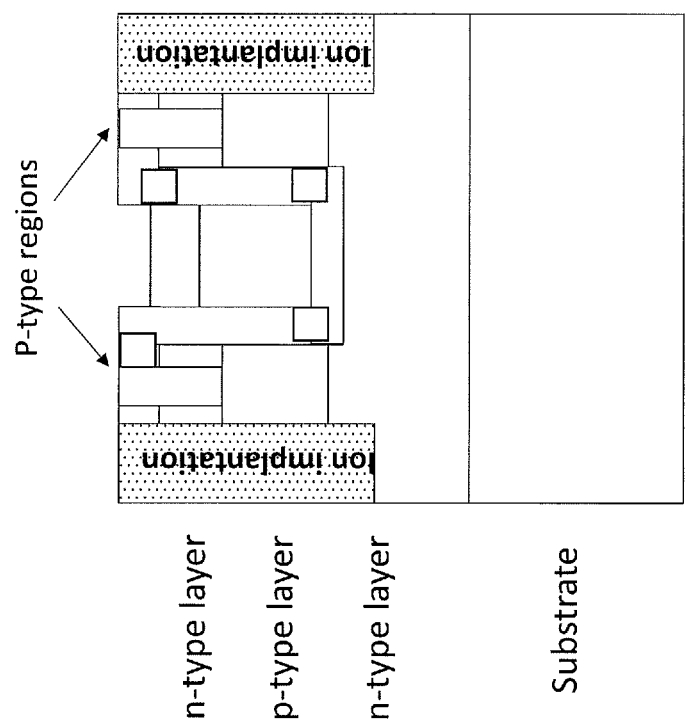

Specific Example 3. Vertical Trench Gate Transistor. The process of fabricating a vertical trench gate transistor with Mg-doped p-type base regions is shown in FIGS. 16A through 16H. The process begins with MOCVD growth of p-type/n-type structures with a lightly Si-doped drift region on top of the homogeneous substrate as in FIG. 16A. As in FIG. 16B, a trench is etched using a dry etch or wet etch method. The sample then is sent to the MOCVD chamber to grow the n-type region channel region and/or the gate dielectric as shown along the upper surface of the structure in FIG. 16C. The first selective-area ion implantation in the shaded areas is performed to connect the atmosphere to the buried p-type base region as shown in FIGS. 16D and 16E, with an exploded view of the center portion of the structure shown in FIG. 16F.

Figure 16H:
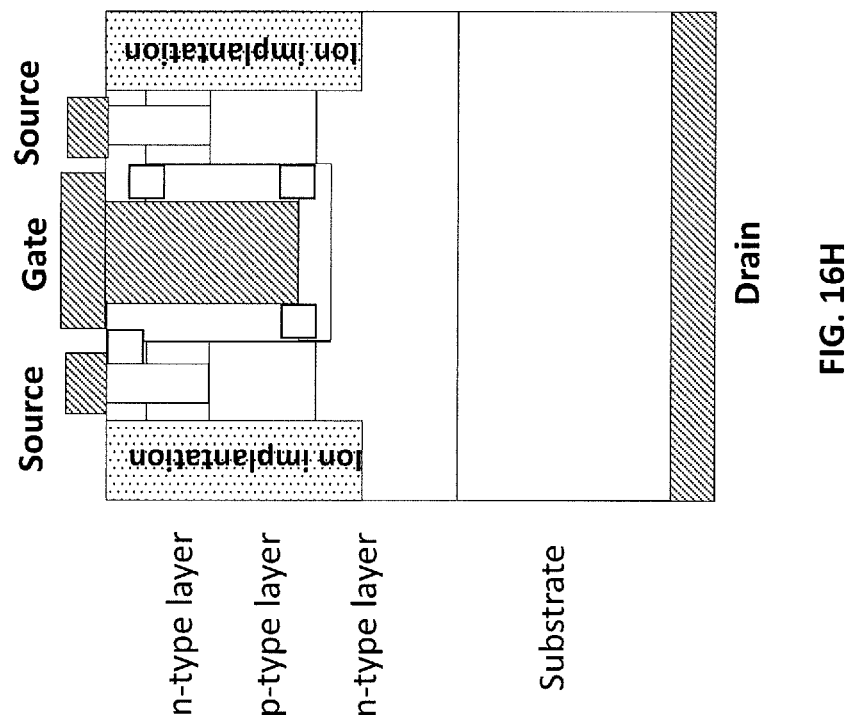
Figure 16G:
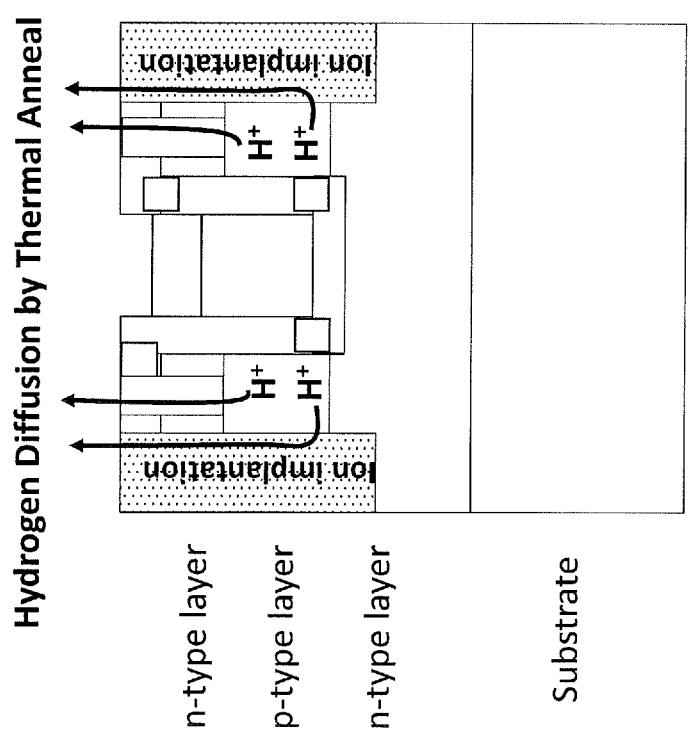

As shown in FIGS. 16G and 16H, ion-implantation high-temperature annealing is used to activate the implanted ions and reduce the damage. Second ion implantation is also performed to as device isolation and/or edge termination. The hydrogen in the buried p-type base region can be diffused out through both the first ion implanted region and the second ion implanted region during the thermal treatment, as shown in FIG. 16G. The illustration of FIG. 16H shows the cross-section profile of the full device. The source-to-p-type base region ohmic contact is formed by the source metal to the (second) ion implanted region, under the (shaded) source metal.

Figures 17A, 17B:
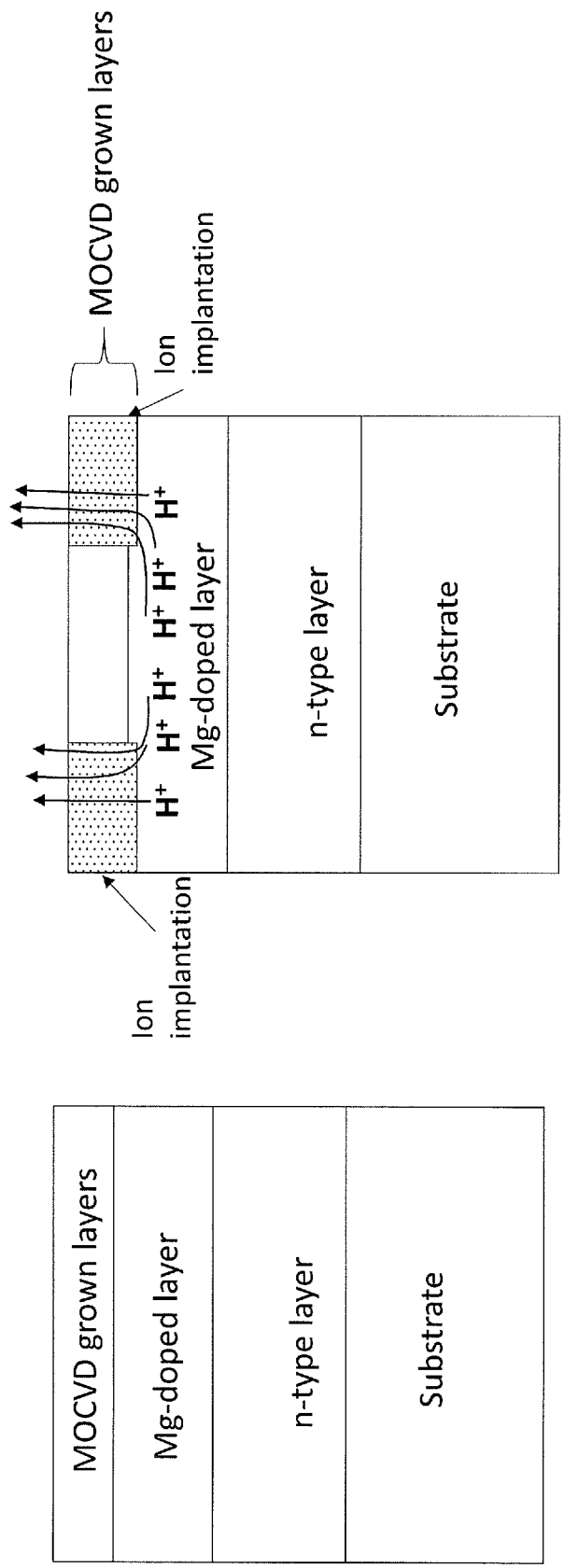
FIGS. 17A and 17B shows the structure preparation for light emitting diodes or laser diodes . . . according to certain exemplary aspects of the present disclosure.

Specific Example 4. Light emitting diodes and laser diodes. FIG. 17A shows the epitaxial structure for light emitting diodes and laser diodes with buried Mg-doped III-Nitride layers. FIG. 17B shows the cross-section of the structure after the selective-area ion implantation. The hydrogen in the buried Mg-doped layers can be diffuse out through the ion implanted region under thermal treatment.

In yet further examples according to the present disclosure, aspects are directed to an avalanche photodiode/device and/or a process for its manufacture, and involving with a buried p–GaN layer and on a GaN-on-GaN structure using optimized implanted-edge-termination design to avalanche photodiodes (APDs) based on GaN p-i-n diode structure grown on a single crystalline, low defect density GaN substrate ("p-i-n" referring to an intrinsic semiconductor region between p-type and n-type semiconductor regions). A robust avalanche capability may be demonstrated with such a buried p–GaN design, using an activation p–GaN technique and an ion implanted edge termination. Such APDs may exhibit extremely low dark current of about 2 nA and a record high gain of above about $10^5$. Such a device may also perform well at high temperatures of about 525 degrees K, for example. Exemplary embodiments are discussed in further detail below with regards to FIG. 18 and additionally in Appendix A of the above-referenced Provisional Application Ser. No. 62/915,488.

Figure 19A:
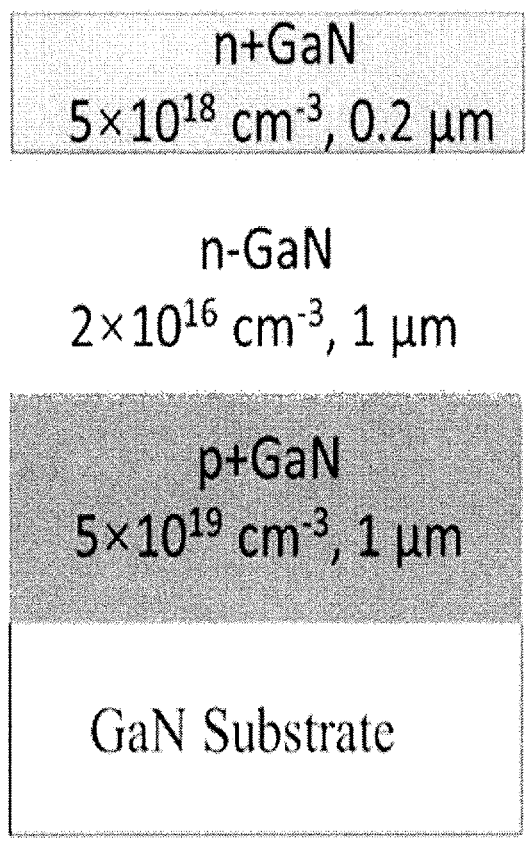
FIG. 19A is a cross-section schematic illustration of epitaxial layers on bulk GaN, in accordance with another example of the disclosure.

Other exemplary aspects of the disclosure are directed to an apparatus involving an avalanche photodiode/device, and/or such a manufactured device, with a buried p–GaN layer and Mg-ion implanted edge termination. The device may have an n-i-p structure with a buried p–GaN layer. By adopting Mg-ion implanted edge termination, the device may exhibit robust avalanche capability, which may be confirmed by temperature-dependent breakdown voltage and electroluminescence. Exemplary embodiments are discussed in further detail below with regards to FIGS. 19A, 19B and additionally in Appendix B of the above-referenced Provisional Ser. No. 62/915,488.

Still other exemplary aspects of the disclosure are directed to a photo-assisted method used to measure the hole drift velocity in a GaN p-i-n diode. By illuminating the cathode region of the reverse-biased diode, photocurrent induced only by holes can be obtained. A uniform electric field distribution may be achieved using the Mg-ion implanted edge termination. Such a photo-assisted method enabled the direct measurement of the carriers' drift velocity in GaN. Exemplary embodiments are discussed in further detail below with regards to FIGS. 20A, 20B and additionally in Appendix C of the above-referenced Provisional Ser. No. 62/915,488.

Other exemplary aspects of the disclosure are directed to charge-balanced devices including a buried p-type GaN layer. A charge-balanced device structure may optimize electric field distribution and enable avalanche breakdown. Exemplary embodiments are discussed in further detail below with regards to various examples such as in FIGS. 21(*a*), 21(*b*) and 21(*c*), and additionally in Appendix D of the above-referenced Provisional Ser. No. 62/915,488.

Figure 18:
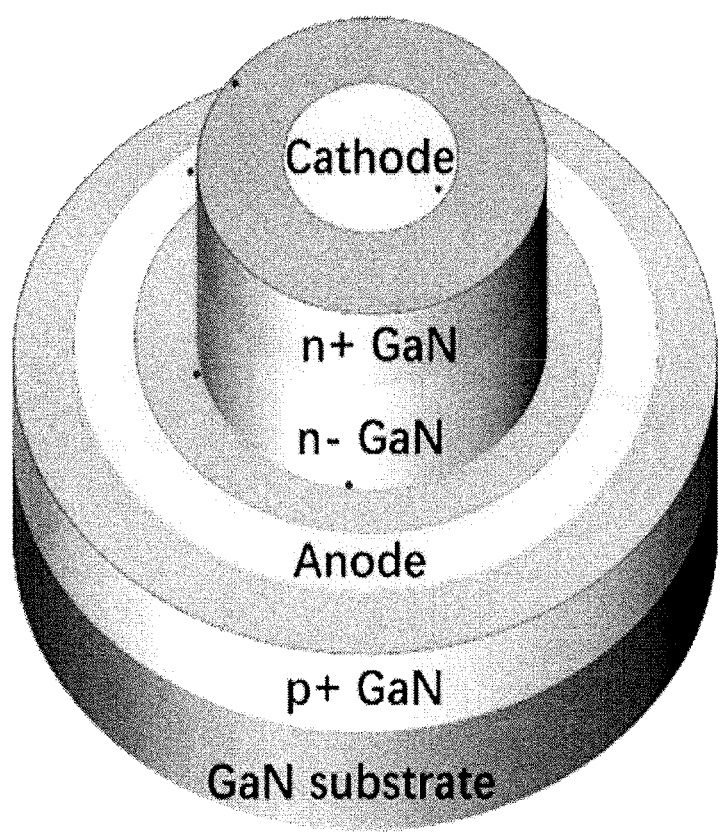
FIG. 18 is a schematic illustration of a GaN avalanche photodiode, in accordance with another example of the present disclosure.

More specifically, FIG. 18 is a cross-section schematic, example illustration of a GaN avalanche photodiode, which is a known exemplary type of a p-i-n diode. The exemplary epitaxial structure shown began with growing a 1-μm-thick p+GaN layer on top of a free standing GaN substrate. A 1-μm-thick n– GaN drift layer and a 200-nm-thick n+GaN layer were grown on top of the p+GaN by MOCVD. The measured dislocation density of the epitaxial layers was on the order of $10^6$ cm$^{-2}$.

Exemplary device fabrication included mesa etching to reach the p+GaN layer. A 1.4-μm-deep mesa was etched using Cl$_2$/BCl$_3$ gases in reactive ion etching (RIE) with a low power of 15 W. The low power RIE etching was optimized to minimize plasma damages. The device edge termination was realized by a two-step Mg ion implantation: 50 keV (dose=3×10$^{14}$ cm$^{-2}$) and 190 keV (dose=1×10$^{15}$ cm$^{-2}$). The Mg ions also may have compensated for plasma damages introduced by the mesa etching, which may have eliminated sidewall leakage. The buried p+GaN was activated by diffusing out hydrogen in a rapid thermal annealing tool at 800° C. A Ni/Au metal stack was deposited for an anode electrode, and a Ti/Au metal stack was deposited for a cathode electrode.

The GaN p-i-n avalanche photodiode shown in FIG. 18 was designed and fabricated on the free-standing GaN substrate. The device offered an avalanche breakdown at a reverse bias of 278V with the breakdown voltage increased with rising temperatures, a clear signature of avalanche. The dark current recorded was 2 nA, and no increase in leakage current was observed until avalanche breakdown. Under the reverse bias, electroluminescence was observed when impact ionization occurred. The device showed a peak photoresponsivity at the wavelength between 350 nm and 370 nm. When the avalanche occurred (reverse bias=280 V), the photoresponsivity was 60 A/W, corresponding to a QE of 2×10$^4$%. The device operated under a high temperature up to 525 K (250° C.) with an optical gain of $10^5$. Further details of the device shown in FIG. 18 and related methods are described in Appendix A of the above-referenced Provisional Ser. No. 62/915,488.

Figure 19B:
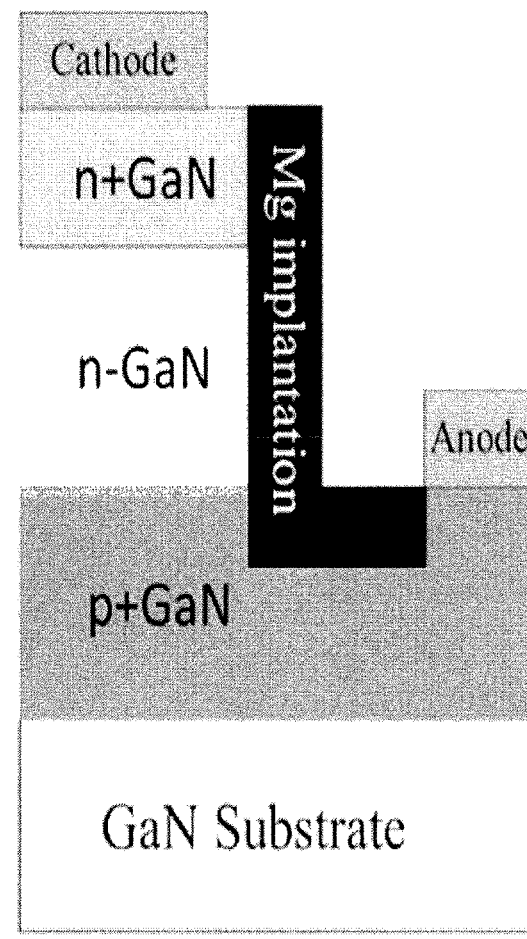
FIG. 19B is a cross-section schematic illustration of a device structure including the layers shown in FIG. 19A, in accordance with yet another example of the disclosure.

FIG. 19B is a cross-section schematic, example illustration of a GaN impact ionization avalanche transit-time (IMPATT) diode. The example shown includes epitaxial layers that were grown on a bulk GaN substrate. The epitaxial structure included a 1-μm-thick p+GaN layer with the Mg doping density of 5×10$^{19}$ cm$^{-3}$, a 1-μm-thick n– GaN drift layer with silicon (Si) doping density about 2×10$^{16}$ cm$^{-3}$, and a 200-nm-thick n+GaN layer with the Si doping density of 5×10$^{18}$ cm$^{-3}$, all grown by MOCVD. The measured dislocation density of the epitaxial layers was on the order of $10^6$ cm$^{-2}$ using X-ray powder diffraction (XRD). The net charge concentration of the n–GaN drift layer was analyzed by C–V measurement. The net charge density can be calculated by $$n = \frac{2}{q\varepsilon_0\varepsilon_s a(1/C^2)/dv},$$

where $\varepsilon_s$ is the relative dielectric constant of GaN, and C is the measured capacitance.

Exemplary device fabrication included mesa etching to reach the p+GaN layer. A 1.4-μm-deep mesa was etched using Cl$_2$/BCl$_3$ gases in RIE. Device edge termination was realized by a two-step Mg ion implantation: 50 keV (dose=3×10$^{14}$ cm$^{-2}$), and 190 keV (dose=1×10$^{15}$ cm$^{-2}$). The Mg ion implantation also may have compensated the plasma damages introduced by the plasma etching, which may have eliminated sidewall leakage. The buried p+GaN layer was activated by diffusing out the hydrogen in a rapid thermal annealing tool. A Ni/Au metal stack was deposited for an anode electrode, and a Ti/Au metal stack was deposited for a cathode electrode.

While IMPATT diodes are appreciated for their high-power capability, they manifest varying degrees of leakage current even when they, ideally, are voltage biased to block current flow (until the diode breakdown voltage is reached). As disclosed herein and supported at least in part by these experimental efforts, aspects of the instant disclosure are directed to the surprising/unexpected results of mitigating this leakage (particularly at structure sidewall(s)) or stopping such leakage altogether, thereby permitting such devices (e.g., IMPATT diodes among other semiconductive structures mentioned herein (and including the Appendices of the above-referenced Provisional Ser. No. 62/915,488) to operate more ideally at or nearer their empirical limits.

The IMPATT diode, based on GaN-on-GaN structure, was been fabricated as shown in FIG. 19B. By using Mg-ion implanted edge termination, the GaN diode showed robust avalanche breakdown. The breakdown voltage increased with rising temperature by 0.1 V/K, which followed the nature of avalanche. A series type resonator was designed based on the fabricated GaN IMPATT diode, and an oscillation frequency of 0.8 GHz was observed. Further details of the device shown in FIG. 19B and related methods are described in Appendix B of the above-referenced Provisional Ser. No. 62/915,488.

Figure 20A:
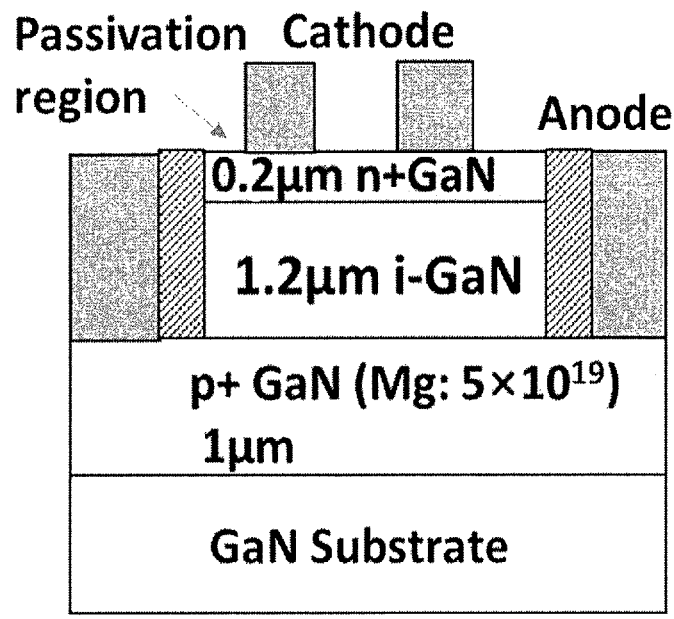
FIG. 20A is a cross-section schematic illustration of a fabricated p-i-n device structure with buried p–GaN, in accordance with another example of the disclosure.

FIG. 20A is a cross-section schematic, example illustration of a p-i-n diode with a buried p–GaN layer designed and fabricated on a bulk GaN substrate. The epitaxial structure of the p-i-n diode began with growing a 1-µm-thick p+GaN layer ([Mg]: $5\times10^{19}$ cm$^{-3}$) on top of the free-standing GaN substrate. A 1.2-µm-thick GaN drift layer and 200-nm-thick n+GaN cathode layer ([Si]: $5\times10^{18}$ cm$^{-3}$) were grown by MOCVD. Under UV-light (UVL) illumination, electron-hole pairs were generated in the cathode layer. When the device was reverse biased, the photo-generated holes were swept into the depletion region drifted by electric field, while the photo-generated electrons were collected by the cathode.

Figure 20B:
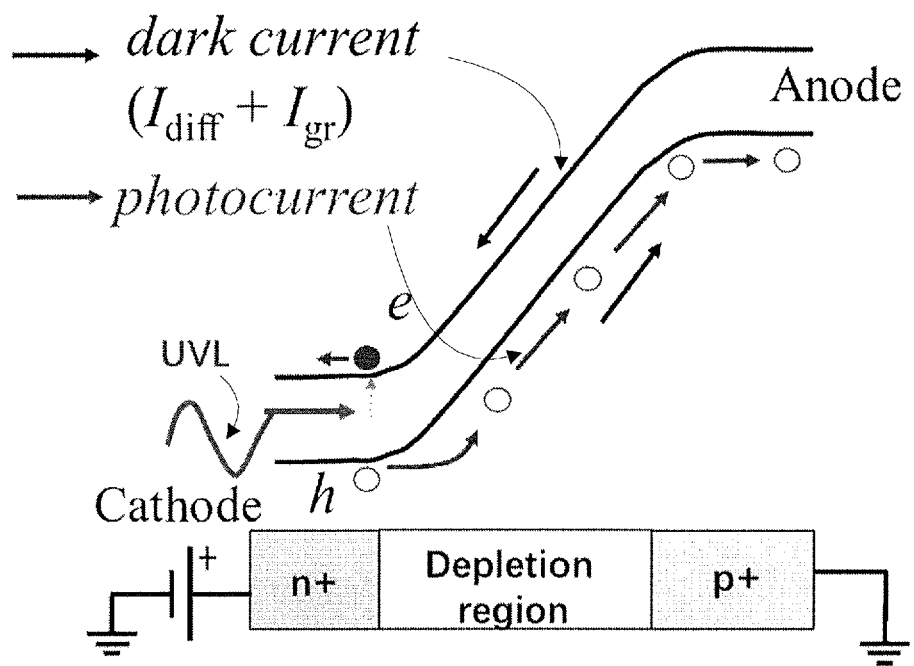
FIG. 20B is an illustrative energy band diagram and current components in the device of FIG. 20A under UV-light illumination, in accordance with another example of the disclosure.

FIG. 20B shows the current components in the device of FIG. 20A under UVL illumination, which include dark current ($I_{dark}$) and photocurrent ($I_{Pho}$). The photocurrent $I_{Pho}$ induced by photo-generated holes can be written as:

$$I_{Pho} = I_{UV} - I_{dark}, \quad (1)$$

where $I_{UV}$ is the measured reverse current under UVL illumination, and $I_{dark}$ is the measured reverse current under the dark condition. The drift velocity of photo-generated holes can be calculated from $$v_d = \frac{I_{Pho}}{qn_h A}, \quad (2)$$

where, $n_h$ is the hole concentration, and A is the device area. The exemplary device of FIG. 20A may undergo a photo-assisted method adopted to measure drift velocity of holes in GaN. A GaN p-i-n diode with a buried p–GaN layer was designed and fabricated. By illuminating the cathode region of the reverse biased p-i-n diode, the photocurrent can be measured, and the drift velocity of photo-generated holes can be extracted experimentally. Both the photocurrent and drift velocity of photo-generated holes may follow the Caughey-Thomas model with a fitting parameter of 1.75. The measured drift velocity of holes in GaN can be written as $v_d = \mu_{LF} E/[1+(\mu_{LF} E/v_{sat})^\beta]^{1/\beta}$, where $\mu_{LF}=17$ cm$^2$/Vs is the low-field hole mobility, $v_{sat}=6.63\times10^6$ cm/s is the saturation velocity, $\beta=1.75$ is the fitting parameter. Further details of the device shown in FIG. 20A and related methods are described in Appendix C of the above-referenced Provisional Ser. No. 62/915,488.

Figure 21A:
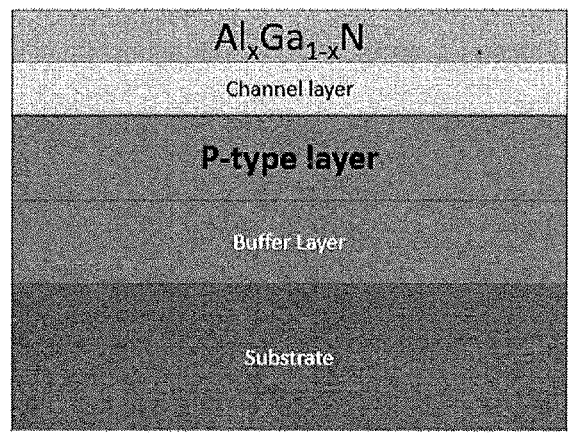
FIG. 21A is a cross-section schematic illustration of epitaxial layers of a charge-balanced device structure, in accordance with yet another example of the disclosure.
Figure 21B:
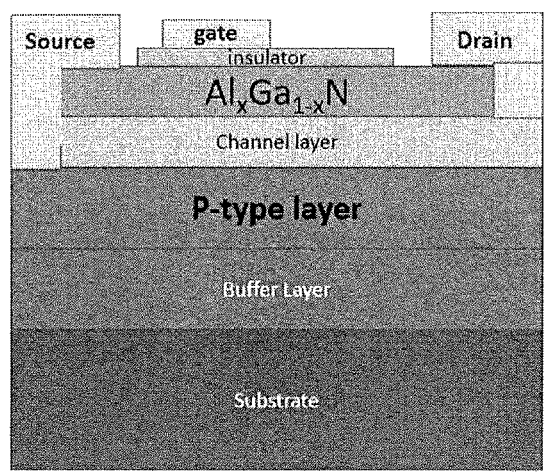
FIG. 21B is a cross-section schematic illustration of a device structure including the layers shown in FIG. 21A, in accordance with another example of the disclosure.
Figure 21C:
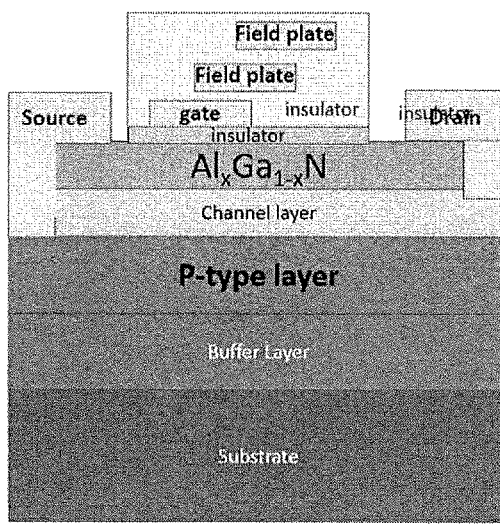
FIG. 21C is a cross-section schematic illustration of a device structure including the layers shown in FIG. 21A, in accordance with yet a further example of the disclosure.

FIG. 21A is a cross-section schematic, example illustration of an epitaxial structure of a charge-balanced device including a buried p-type GaN layer. A layer of AlGaN is shown as a top-most layer in FIG. 21A. FIG. 21B shows how the epitaxial structure of FIG. 21A is incorporated into an exemplary device structure. The buried p-type GaN layer can provide negative charges. A peak electric field can be reduced due to a charge balance of positive charges in the AlGaN/GaN interface and the negative charged in the buried p-type GaN layer. FIG. 21C shows another example device structure incorporating the epitaxial layer structure of FIG. 21A. FIGS. 21B and 21C are examples of high electron mobility transistors (HEMTs). Further details of the device shown in FIG. 21B is described in Appendix D.

In yet a further example, aspects of the present disclosure are directed to a tunnel junction light emitting diode (LED), which incorporates such features including a buried region, an ion implanted diffusion path with thermal treatment to diffuse out hydrogen through the ion implanted path and to cause activation of the buried region.

Other example aspects include at least one of or a combination of at least one p-type dopants in a material having at least one III-Nitride material or III-V material, creating a diffusion path ("ion diffusion path") that includes hydrogen by using ion implantation via at least one ion species, and in response, applying thermal treatment to diffuse out hydrogen through the ion implanted path and to cause activation of the buried region. In one version of this example, the tunnel junction LED may incorporate various layers adjacent to or over a substrate and including: an active region which includes at least one p-type III-Nitride and one n-type III-Nitride layers; a tunnel junction region or layer(s) including or consisting of a heavily doped n-type III-Nitride material and a heavily doped p-type III-Nitride material; and a contact layer formed by heavily doped III-Nitride (n-type) material. In an experimental example consistent with this version layers built up from the substrate are as follows: an n–GaN layer; an InGaN active region; a p– GaN (Mg-doped) region; a tunnel junction region including heavily doped layer/region having a p+ GaN (Mg-doped) and then including another heavily doped layer/region having 10 nm n+ GaN (Si doping: $2\times1020$ cm$^{-3}$), and next an intermediate layer including 400 nm n+ GaN (Si doping: $2.9\times1019$ cm$^{-3}$)), and finally a heavily-doped contact layer including 5 nm n+ GaN (Si doping: $2\times1020$ cm$^{-3}$). Both the contact layer and tunnel junction may be grown on the top of the active region, and in terms of activation, the both p-type region of the tunnel junction and the p-type layer of the active region may be activated as described hereinabove. Accordingly, while many different types of tunnel junction LEDs may be advantaged by such aspects, this particular example has buried p– GaN layers, which are to be activated. This and related examples are also illustrated in Appendix E of the above-identified U.S. Provisional Application Ser. No. 62/915,488.

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the FIGS. as well as other devices, as each such described embodiment has one or more related aspects which may be modified and/or combined with the other such devices and examples as described hereinabove may also be found in the Appendices of the above-referenced Provisionals.

The skilled artisan would also recognize various terminology as used in the present disclosure by way of their plain meaning. As examples, the Specification may describe and/or illustrates aspects useful for implementing the examples by way of various semiconductor materials/circuits which may be illustrated as or using terms such as layers, blocks, modules, device, system, unit, controller, and/or other circuit-type depictions. Also, in connection with such descriptions, the term "source" may refer to source and/or drain interchangeably in the case of a transistor structure. Such semiconductor and/or semiconductive materials (including portions of semiconductor structure) and circuit elements and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed:

1. A method comprising:
in a semiconductive device having a buried region including at least one p-type dopant or a combination of p-type dopants in a material having at least one III-Nitride material or III-V material, creating a diffusion path ("ion diffusion path") that includes hydrogen, by using ions via at least one ion species implanted in at least one selected region of material of the semiconductive device, and in response, applying thermal treatment to diffuse out hydrogen through the ion diffusion path and to cause activation of the buried region.

2. The method of claim 1, wherein the buried region includes GaN alone or GaN in combination with another III-Nitride material or III-V material, and wherein the at least one ion species includes at least one or a combination of: Magnesium (Mg), Palladium (Pd), Platinum (Pt), Aluminum (Al), Nitrogen (N), Argon (Ar), Beryllium (Be), and Helium (He).

3. The method of claim 1, wherein the thermal treatment is performed during and/or after ion implantation to diffuse out hydrogen causes hydrogen to diffuse into an atmosphere surrounding the semiconductive device, and wherein: the buried region is a p-type region characterized by Mg-doped III-Nitride; the ion diffusion path is created by a selective-area ion implantation; and the post-ion implantation thermal treatment diffuses out hydrogen from the p-type region characterized by the Mg-doped III-Nitride.

4. The method of claim 1, wherein the step of creating a diffusion path to diffuse out the hydrogen mitigates, or avoids, damaging a region where an ohmic contact may exist.

5. The method of claim 1, wherein due to the hydrogen in the diffusion path, the buried region doped with a III-Nitride material or III-V material is not an active p-type semiconductor until after the step of applying a post-ion implantation thermal treatment to diffuse out hydrogen.

6. The method of claim 1, wherein the buried region includes a current blocking layer (CBL), and further including the step of applying a post-ion implantation thermal treatment to diffuse out hydrogen from the CBL.

7. The method of claim 1, wherein the semiconductive device includes a current blocking layer (CBL), wherein the diffusion path is a channel, created by using MOCVD regrown layers, and wherein the step of applying a post-ion implantation thermal treatment is to facilitate diffusing out hydrogen from the CBL.

8. The method of claim 1, wherein the semiconductive device includes a current blocking layer (CBL), wherein the step of applying a post-ion implantation thermal treatment is to diffuse out hydrogen from the CBL, and the method further includes forming a source-to-CBL-ohmic contact region without exposing the CBL to a surrounding atmosphere and without damaging the source-to-CBL-ohmic contact.

9. The method of claim 1, further including using the semiconductive device to form one or a combination of the following: an avalanche photodiode/device, a single-photon avalanche detector; a III-Nitride light emitting diode; a laser diode; a vertical III-Nitride trench gate device; a GaN-based power transistor device; a III-Nitride current aperture vertical electron transistor; impact ionization Avalanche Transit-Time (IMPATT) diode; a bipolar-junction transistor; a PIN diode; a tunneling diode; a tunnel junction light emitting diode; and a high electron mobility transistor (HEMT) with buried p-type region.

10. The method of claim 1, wherein the step of creating a diffusion path includes using p-type dopant implantation, and wherein the buried region includes a p-type GaN material or p-type GaN layer.

11. The method of claim 1, wherein another ion implantation is also performed to provide isolation and/or edge termination.

12. A method comprising:
in a semiconductive device having a p-type dopant in a III-Nitride material or III-V material, defining a current blocking layer (CBL) using ion implantation and post-ion implantation annealing;
forming a channel having ions implanted along at least one selected material region for creating a hydrogen diffusion path that is part of the channel and that extends towards the CBL;
applying a thermal treatment during and/or after ion implantation to diffuse out hydrogen, through the at least one selected material region, from the CBL; and
forming a source-to-CBL-ohmic contact using ion implantation.

13. The method of claim 12, further including using the semiconductive device to form one or a combination of the following: an avalanche photodiode/device; a light emitting diode; a laser diode; a vertical III-Nitride trench gate device; a GaN-based power transistor device; and a current aperture vertical electron transistor.

14. The method of claim 12, wherein the CBL is a buried region doped with a III-Nitride material that includes GaN alone or GaN in combination with another III-Nitride material or III-V material.

15. A semiconductor structure comprising:
a semiconductive portion having a buried region including at least one p-type dopant or a combination of p-type dopants, and a III-Nitride material or III-V material; and
a diffusion path ("ion diffusion path") defined by a selected material region having implanted ions via at least one ion species and having hydrogen, and wherein the buried region is activated via application of a thermal treatment during and/or after ion implantation to diffuse out hydrogen through the ion diffusion path.

16. The semiconductor structure of claim 15, further including an ohmic contact region at which a source of a transistor interfaces with the buried region, and wherein the ohmic contact region is without etching-based damage due at least in part to the post-ion implantation thermal treatment.

17. The semiconductor structure of claim 15, wherein the semiconductive portion and the ion diffusion path are part of one or a combination of the following: an avalanche photodiode/device; light emitting diode; a laser diode; a vertical III-Nitride trench gate device; a GaN-based power transistor device; current aperture vertical electron transistor; impact ionization avalanche transit-time (IMPATT) diodes; and bipolar-junction transistors.

18. The semiconductor structure of claim 15, wherein the semiconductive portion and the ion diffusion path are part of or refer to an impact ionization avalanche transit-time (IMPATT) diode.

19. The semiconductor structure of claim 15, further including a layer or region in which the ion diffusion path is formed by ion implantation, wherein the layer or region includes or corresponds to one of the following: a cap layer or cap region; an isolation layer or isolation region; and an edge-termination layer or edge-termination region.

20. The method of claim 1, wherein the ion diffusion path is formed in a layer or region of the semiconductive device by selective-ion implantation masking.

21. The semiconductor structure of claim 15, wherein said at least one ion species includes two or more ion species.

22. The method of claim 1, wherein said creating a diffusion path includes using a multi-step anneal process characterized by annealing at one or more temperatures closer to or at 850 degree Celsius than 750 degree Celsius, followed by a cooling step, and then annealing again at one or more temperatures closer to or at 850 degree Celsius.

23. The method of claim 1, wherein the step of applying thermal treatment includes annealing at a temperature closer to or at 850 degree Celsius than 750 degree Celsius.

24. The method of claim 1, wherein the ion diffusion path is created in one or more certain layers or regions of the semiconductive device by implanting ions into the one or more certain layers or regions, wherein the one or more certain layers or regions includes, from among the following: a cap layer or region, a current blocking layer or region, and an isolation layer or isolation region.

25. The method of claim 12, wherein: the CBL is a p-type region defined in part by including a p-type dopant, and a III-Nitride or III-V material; the hydrogen diffusion path is created by a selective-area ion implantation; and the post-ion implantation thermal treatment diffuses out hydrogen from the p-type region.

26. The method of claim 1, wherein the ion diffusion path is created in one or more certain layers or regions of the semiconductive device by implanting ions into the one or more certain layers or regions, which includes an edge-termination layer or edge-termination region.

27. The method of claim 12, wherein the step of forming a channel includes using MOCVD regrown layers.

28. The method of claim 12, wherein the step of forming a channel is performed without damaging the source-to-CBL-ohmic contact, and the at least one selected material region is elongated in a direction that is orthogonal to parallel planes along which respective layered regions of the semiconductive device are formed.

29. The method of claim 12, wherein the step of forming a channel includes using Mg-ion implantation.

30. The method of claim 12, further including in the semiconductive device, forming a transistor having a source-to-CBL ohmic contact using Mg-ion implantation.

\* \* \* \* \*